(12) United States Patent
Kobayashi et al.

(10) Patent No.: US 6,197,149 B1
(45) Date of Patent: Mar. 6, 2001

(54) PRODUCTION OF INSULATING VARNISHES AND MULTILAYER PRINTED CIRCUIT BOARDS USING THESE VARNISHES

(75) Inventors: Kazuhito Kobayashi, Yuki; Yasushi Kumashiro, Shimodate; Atsushi Takahashi, Yuki; Koji Morita; Takahiro Tanabe, both of Shimodate; Kazunori Yamamoto, Tsukuba; Akishi Nakaso, Oyama; Shigeharu Arike, Tochigi-ken; Kazuhisa Otsuka, Shimodate; Naoyuki Urasaki, Tsukuba; Daisuke Fujimoto, Shimodate; Nozomu Takano, Yuki, all of (JP)

(73) Assignee: Hitachi Chemical Company, Ltd., Tokyo (JP)

( * ) Notice: Under 35 U.S.C. 154(b), the term of this patent shall be extended for 0 days.

(21) Appl. No.: 09/057,522

(22) Filed: Apr. 9, 1998

(30) Foreign Application Priority Data

| Apr. 15, 1997 | (JP) | 9-096298 |
| Apr. 15, 1997 | (JP) | 9-096299 |
| Apr. 15, 1997 | (JP) | 9-096300 |
| Apr. 15, 1997 | (JP) | 9-096301 |
| Apr. 15, 1997 | (JP) | 9-096302 |
| Jun. 24, 1997 | (JP) | 9-166448 |
| Oct. 8, 1997 | (JP) | 9-275377 |

(51) Int. Cl.$^7$ ............... C09J 5/00; C09J 9/00; C09J 11/08; B32B 18/00; B32B 19/00
(52) U.S. Cl. ............ 156/305; 156/325; 156/330; 156/230; 156/276; 428/297.4; 428/298.7; 428/299.4; 428/301.4
(58) Field of Search .................... 156/230, 325, 156/330, 276, 305; 428/296.1, 296.7, 297.4, 298.7, 299.4, 299.7, 301.4; 525/481, 528, 423, 430, 452, 453, 454, 504

(56) References Cited

U.S. PATENT DOCUMENTS

| 3,476,641 | 11/1969 | Milewski . |
| 4,496,621 | 1/1985 | Hubert et al. . |
| 4,839,232 | 6/1989 | Morita et al. . |
| 4,888,247 | 12/1989 | Zweben et al. . |
| 4,956,316 | * 9/1990 | Sawyer .................. 501/88 |
| 4,992,325 | 2/1991 | Kim et al. . |
| 4,996,097 | 2/1991 | Fischer . |
| 5,137,594 | 8/1992 | Asada et al. . |
| 5,273,822 | 12/1993 | Hayashi et al. . |
| 5,552,210 | 9/1996 | Horn, III et al. . |
| 5,576,398 | * 11/1996 | Takahashi et al. ............ 525/528 |

FOREIGN PATENT DOCUMENTS

| 50-80364 | 6/1975 | (JP) . |
| 52-120205 | 10/1977 | (JP) . |
| 60-60134 | 4/1985 | (JP) . |
| 61-49824 | 3/1986 | (JP) . |
| 63-102927 | 5/1988 | (JP) . |
| 255757 | 2/1990 | (JP) . |
| 4257430 | 9/1992 | (JP) . |

OTHER PUBLICATIONS

Skeist, I. "Handbook of Adhesives, 3rd. ed." Van Nostrand Reinhold, pp. 9, 10, and 355, 1990.*
Database WPI, Derwent Publications Ltd., AN 1980–22474, Apr. 10, 1979.
Database WPI, Derwent Publications Ltd., AN 1995–213192, Nov. 1, 1999.
Database WPI, Derwent Publications Ltd., AN 1988–232197, Jul. 9, 1988.

* cited by examiner

*Primary Examiner*—Richard Crispino
*Assistant Examiner*—J. A. Lorengo
(74) *Attorney, Agent, or Firm*—Antonelli, Terry, Stout & Kraus, LLP

(57) ABSTRACT

An insulating varnish comprising a resin component, electrical insulating whiskers, and if necessary, one or more additives such as an ion adsorbent, and/or an organic reagent for preventing injury from copper, produced by adding the additives to the resin component and the whiskers, or filtering the whiskers, or milled by using a beads mill or a three-roll mill, or the like, is excellent for producing a multilayer printed circuit board having high wiring density, high reliability and excellent other electrical properties.

13 Claims, No Drawings

PRODUCTION OF INSULATING VARNISHES AND MULTILAYER PRINTED CIRCUIT BOARDS USING THESE VARNISHES

BACKGROUND OF THE INVENTION

The present invention relates to processes for producing electrical insulating varnishes used for insulating materials or adhesive films for printed circuits boards which can comply with the request for smaller thickness and higher wiring density of such circuit boards on which electronic parts are mounted, and multilayer printed circuit boards made by using such insulating varnishes.

Printed circuit boards are usually produced by forming circuits on copper-clad laminates obtained by laminating copper foils and prepregs and molding the laminates by heating under pressure.

Multilayer printed circuit boards are manufactured by forming circuits on the surfaces of multilayer copper-clad laminates having inner layer circuits formed therein, which laminates have been obtained by hot-pressure laminating said printed circuit boards, or those boards and copper foils, with prepregs interposed therebetween.

As prepregs for printed circuit boards, there have been used glass cloth prepregs obtained by impregnating a resin in glass cloth and drying the resin into a half-curedstate. In manufacture of multilayer printed circuit boards, adhesive films made of half-cured resins having film forming properties, which are prepregs containing no glass cloth, such as disclosed in JP-A-6-200216 and JP-A-6-242465, or adhesive films having a copper foil formed on one side, such as proposed in JP-A-6-196862, have been used beside said glass cloth prepregs.

When the term "film forming properties" is used in this specification, it means the quality of the resin which is unsusceptible to such trouble as cracking or chip-off during transport, cutting, lamination and other works of prepregs and to troubles in the ensuing hot-pressure molding, such as abnormal diminution of the interlayer insulating layers at the areas where the inner layer circuits are present, lowering of interlayer insulation resistance, and short-circuiting.

The recent years have seen sharp acceleration of the tendency to smaller size and weight, higher performance and lower production cost of electronic devices, consequently calling for higher packaging density, smaller thickness, higher reliability and lower cost of the printed circuit boards used in such electronic devices.

For realizing higher density of printed circuit boards, finer wiring is essential, and this requires good surface flatness and high dimensional stability. Formation of fine through-holes and/or interstitial via holes (IVH) and good laser drilling workability are also demanded. For obtaining higher surface flatness, it is necessary to enhance fluidity of the resin during multilayer laminate molding, and this purpose can best be met by use of a thermosetting resin such as epoxy resin.

Epoxy resins, however, show high fluidity because of low molecular weight at the stage before molding and are incapable of forming a sheet-shaped insulating material. Hitherto, therefore, prepregs prepared by impregnating an insulating resin in a reinforcing base material such as glass cloth have been used for forming the insulating layers, but it has become hardly possible for these conventional prepregs to answer to the above requirements.

The glass cloth generally used for prepregs at present has the spaces between the yarns (glass fiber bundles) enlarged proportionally as its thickness is reduced. Therefore, the smaller the thickness of the cloth, the higher becomes the probability of occurrence of a phenomenon in which yarns are bent or the warp and weft, which normally ought to cross at right angles, fail to cross at right angles. This phenomenon tends to cause an abnormal dimensional change or warping after hot pressure molding. Further, the smaller the thickness of glass cloth, the greater are the spaces between the yarns, hence the lower becomes the volume fraction of prepreg fibers, resulting in a reduced rigidity of the interlayer insulating layer. This tends to enlarge dimensional deflection in the steps, such as parts packaging step, after working of outer layer circuits.

The minimal permissible thickness of currently used glass cloth is 30 $\mu$m, and the thickness of prepregs using glass cloth of such minimal thickness is about 40 $\mu$m. If the resin proportion is reduced for making the prepreg thickness smaller than this, resin filling of the recesses of inner layer circuits is adversely affected, allowing formation of voids. Also, thickness reduction of glass cloth beyond the above limit invites corresponding lowering of strength of the cloth itself, so that the glass cloth becomes liable to break in the step of immersion of the glass cloth in the resin, making it difficult to produce the desired prepregs. Another problem of the multilayer printed circuit boards made by using these glass cloth-based prepregs is that there tends to take place center deflection or lost of core center due to ununiform distribution of glass cloth during fine drilling, resulting in break of the drill. Due to the presence of glass fibers, laser drilling efficiency is low and unevenness of inner layer circuits tends to emerge on the surface to degrade surface flatness of the board. Therefore, use of the presently available glass cloth-based prepregs can not accommodate the mounting requirements for higher packaging density and smaller thickness of the multilayer printed circuit boards.

On the other hand, the adhesive films or copper-foiled adhesive films made of prepregs containing no glass cloth have the advantage of enabling production of the circuit boards with smaller thickness and are also prominent in fine drilling workability, laser drilling efficiency and surface flattening performance. However, the multilayer printed circuit boards made of these prepregs are intolerably low in rigidity because of absence of glass cloth base in the outer insulating layers. This low rigidity is most manifest under high temperatures and causative of positional deflection during packaging of parts. It is also responsible for poor wire bonding workability. Further, because of large thermal expansion coefficient due to the absence of glass cloth in the outer insulating layers, the difference in thermal expansion between the board and the packaged parts is large, hence reliability of connection to the packaged parts is low. Also, cracking or break tends to occur at the solder joints due to thermal expansion or contraction of the board as it is heated or cooled. Thus, with the adhesive films or copper-foiled adhesive films made of the currently used glass cloth-free prepregs, it is hardly possible to comply with the rising request for higher packaging density and smaller size of the multilayer printed circuit boards.

As a new insulating material that can meet the requests for higher packaging density, smaller size, higher reliability and lower cost of multilayer printed circuit boards, which could not be attained with the conventional prepregs, there has been offered a sheet-like insulating material produced by casting a varnish containing no glass cloth and having electrical insulating whiskers dispersed in the insulating resin for shape retention. It was found, however, that this insulating material also had the problems. For instance, for dispersing electrical insulating whiskers in the insulating resin, a specific mixing equipment is required, and it is also essential to conduct an appropriate surface treatement of the electrical insulating whiskers used. It was found that even if these requirements are met, the produced insulating material could still cause improper insulation when it is used for multilayer printed circuit boards.

The electrical insulating whiskers have a tendency to aggregate in the dry state, so that for properly dispersing these whiskers in the insulating resin, it is necessary to use a specific mixing equipment or to apply a proper surface treatment on the whiskers. Even if these requirements could have duly been dealt with, it is still impossible to perfectly eliminate the aggregates of these whiskers.

In the multilayer printed circuit boards, the insulating layers are provided with a greater thickness than the inner layer circuits for ensuring filling of surface unevenness of the inner layer circuits. For reducing the overall thickness of the multilayer printed circuit boards, it is desirable to lessen the insulating layer thickness as much as possible within limits that allow retention of required insulation. In view of this, the insulating layer thickness is usually set to be 25 to 100 $\mu$m. Regarding the size (length) of the aggregates of electrical insulating whiskers, when we procured the commercial whiskers by designating their average length to be 30 $\mu$m, the procured whiskers included those having a length exceeding 50 $\mu$m, some of them being longer than 300 $\mu$m. In case a sheet-shaped insulating material using these electrical insulating whiskers is applied to multilayer printed circuit boards, a varnish containing such lengthy electrical insulating whiskers or the aggregates thereof mentioned above is used, so that these whiskers or the aggregates thereof tend to contact each othere between the conductors to cause improper insulation such as observed when using conductive anodic filaments (CAF).

SUMMARY OF THE INVENTION

An object of the present invention is to provide a process for producing an insulating varnish having excellent electrical insulating performance and beneficial to solution of the above problems.

Another object of the present invention is to provide a process for producing a multilayer printed circuit board using said insulating varnish.

The present invention provides a process for producing an insulating varnish, which comprises adding an ion adsobent or an organic reagent for preventing injury from copper to a resin varnish containing electrical insulating whiskers.

The present invention further provides a process for producing an insulating varnish, which comprises refining a resin varnish containing electrical insulating whiskers by passing it through a filter.

The present invention also provide a process for producing an insulating varnish, which comprises preparing a slurry of electrical insulating whiskers by stirring said whiskers, which show cohesiveness in a dry state, in an organic solvent, and blending this slurry in a resin varnish, followed by further stirring.

The present invention is to provide a process for producing an insulating varnish, which comprises preparing a slurry of electrical insulating whiskers by stirring said whiskers in a resin varnish, and milling this slurry by a beads mill.

The present invention still further provides a process for producing an insulating varnish, which comprises preparing a slurry of electrical insulating whiskers by stirring these whiskers in a resin varnish, and milling this slurry by a three-roll mill.

The present invention also provides a process for producing an insulating varnish, which comprises blending a resin component with a solution comprising electrical insulating whiskers and a solvent for surface treatment of said whiskers.

The present invention further provides a process for producing multilayer printed circuit boards using said insulating varnishes.

DESCRIPTION OF THE PREFERRED EMBODIMENTS

The insulating varnishes provided in the present invention comprise a base resin, electrical insulating whiskers, and optional additives such as ion adsorbent and an organic reagent for preventing injury from copper.

These insulating varnishes can be produced from the various processes described below.

First Embodiment of the Present Invention

The insulating varnish producing process according to the first embodiment of the present invention comprises adding an ion adsorbent or an organic reagent for preventing injury from copper to a resin varnish containing electrical insulating whiskers.

In the course of quest for the cause of improper insulation observed when an insulating material made by using an insulating resin containing electrical insulating whiskers is used for the manufacture of multilayer printed circuit boards, the present inventors found that such improper insulation can be accounted for by the fact that in case dispersion of electrical insulating whiskers in the insulating varnish is improper, there exists an area of inadequate or imperfect adhesion at the interface between said insulating whiskers and resin, allowing diffusion of water through this interface to expedite elution of copper of the copper foil by the action of ionic impurities in the insulating layer. Further studies on this subject by the present inventors have led to the remarkable finding that addition of an ion adsorbent or an organic reagent for preventing injury from copper to an insulating varnish is effective for enhancing insulation reliability of the insulating material blended with electrical insulating whiskers in its use as a component material of multilayer printed circuit boards. The present invention is based on this finding.

The essentials of the first embodiment of the present are explained below.

(Ion adsorbent)

Inorganic ion adsorbents are preferably used in the present invention. Inorganic adsorbents are divided into two types: adsorbents which simply adsorb ions and inorganic ion exchangers which perform ion exchange by taking up ions of opposite charge. There are the ones which have both of these properties.

Ion adsorbents are inorganic materials which separate ions through mass transfer from a liquid or solid by availing of adsorptivity of porous solids. Examples of such ion adsorbents include inorganic matters such as stratified or laminar compounds having high heat and chemical resistance, activated carbon, zeolite, synthetic zeolite, silica gel, activated alumina, activated clay and the like. Use of a material which has been made porous and/or pulverized to increase the specific surface area is desirable for elevating the adsorbing performance.

Inorganic ion exchangers are inorganic materials which separate ions through mass transfer from a liquid or solid by verture of ion exchangeability credited to the specific structure of ion-adsorbed inorganic materials. For example, aminosilicic acid condensed zeolite has a three-dimensional structure with part of Si in the silica structure being substituted with Al, and since Al is trivalent, it constitutes anions to take up cations to effectuate neutralization.

Silica gel has its particle surface covered with silanol group which undergoes a slight degree of ionization to release hydrogen ions, thus showing cation exchangeability. Inorganic ion exchangers are superior to ion adsorptive inorganic materials in the aspect of ion uptake since they have both ion adsorptivity of said ion adsorptive inorganic materials and ion exchangeability.

Examples of said inorganic ion exchangers include aminosilicic acid condensed zeolite, silica gel, montmorillonite which is activated clay, IXE-600 (trade name of an antimony-bismuth based compound produced by Toagosei Chemical Industry Co., Ltd.), IXE-700 (trade name of a magnesium-aliminum based compound produced by Toagosei Chemical Industry Co., Ltd.), and IXE-100 (trade name of a zirconium compound produced by Toagosei Chemical Industry Co., Ltd.).

Hydrotalcite is a hydrous carbonate mineral in the hydrotalcite group and known to be capable of capturing halogens. DHT-4A (a trade name, produced by Kyowa Chemical Industry Co., Ltd.) is an example of commercially available hydrotalcite preparations. Hydrotalcite has anion exchangeability, so that it is preferably used in combination with an inorganic ion exchanger having cation exchangeability as this enables elimination of ions of both polarities.

(Organic reagent for preventing injury from copper)

Organic reagent for preventing injury from copper can be used in place cf ion adsorbents. Examples of such organic reagent for preventing injury from copper include hindered phenol-based Yoshinox BB (a trade name, produced by Yoshitomi Pharmaceutical Industries, Ltd.), and triazole- or thiol-based Jisnet DB (a trade name, produced by Sankyo Seiyaku K.K.).

The amount of these additives added needs to be within the range of 1 to 10 parts by weight, preferably 1 to 5 parts by weight, per 100 parts by weight of resin. When said additives are added in excess of 10 parts by weight, there arise the problems such as reduced heat resistance and elevated cost.

(Whiskers)

The whiskers used in the present invention are electrical insulating whiskers, preferably the ones having an elastic modulus of not less than 200 GPa. Use of whiskers with an elastic modulus of less than 200 GPa may be unable to provide sufficient rigidity to the produced multilayer printed circuit boards.

As for the type of whiskers used in the present invention, it is recommended to use one or more materials selected from aluminum borate, wollastonite, potassium titanate, basic magnesium sulfate, silicon nitride and α-alumina. Among them, aluminum borate whiskers have an elastic modulus of about 400 GPa, far higher than that of glass, and are low in thermal expansion coefficient and also comparatively inexpensive. It has been experimentally confirmed that the printed circuit boards produced by using the prepregs of the present invention containing aluminum borate whiskers, as compared with the conventional printed circuit boards using glass cloth, are higher in rigidity at normal and high temperatures, better in wire bonding workability and electrical signal transfer performance, smaller in thermal expansion coefficient and higher in dimensional stability. Thus, aluminum borate is most recommendable as the material of whiskers used in the present invention.

The average diameter of whiskers used in this invention preferably falls within the range of 0.3 to 3 $\mu$m. If the average diameter is less than 0.3 $\mu$m, mixing of whiskers in resin varnish is hindered and also coating workability lowers. If the average diameter of whiskers exceeds 0.3 $\mu$m, surface flatness of the produced board is adversely affected and also microscopical uniform dispersibility of whiskers is impaired. It is more desirable that the average diameter of whiskers be in the range of 0.5 to 1 $\mu$m for the said reasons and better coating properties (easier to coat flatly). Use of whiskers of said diameter range makes it possible to produce printed circuit boards having better surface flatness than obtainable with the conventional glass cloth-based prepregs.

The average length of whiskers is preferably within the range of 3 to 50 $\mu$m. If the average length is less than 3 $\mu$m, the intended reinforcing effect of fibers can not be obtained and it also becomes difficult to effect two-dimensional alignment of whiskers in the resin layer, so that the produced wiring board fails to have satisfactory rigidity. If the average length of whiskers exceeds 50 $\mu$m, it becomes hard to effect uniform dispersion of whiskers in varnish, resulting in impaired coating properties. Also, the probability rises that the whisker which contacted a certain conductor circuit would contact another conductor circuit, giving rise to the risk of causing shirt-circuiting due to migration of copper ions which tend to move along the fibers. For this reason, the average length of whiskers is preferably not greater than 50 $\mu$m. The printed circuit boards made by using the insulating material of the present invention containing whiskers of said length have better migration resistance than the boards using the conventional glass cloth-based prepregs.

It is also recommendable to use whiskers which have been surface treated with a silane coupling agent for further enhancing rigidity and heat resistance of the printed circuit boards. The whiskers surface treated with a silane coupling agent have good wettability and bonding affinity with resins, providing further improvement of rigidity and heat resistance.

There can be used the known types of silane coupling agent, such as silicon type, titanium type, aluminum type, zirconium type, zirco-aluminum type, chromium type, boron type, phosphorus type, and amino-acid type.

Preferable examples of the silane coupling agents are aminosilane coupling agents such as $\gamma$-aminopropyltriethoxysilane, $\gamma$-aminopropyltriethoxysilane, N-($\beta$-aminoethyl)-$\gamma$-aminopropyltriethoxysilane, $\gamma$-phenylaminopropyltriethoxysilane, $\gamma$-phenylaminopropyltrimethoxysilane, etc.; ureidosilane coupling agents such as ureidopropyltriethoxysilane, etc.; vinyl silane coupling agents such as vinyltriethoxysilane, vinylmethyldimethoxysilane, etc.; methacryl silane coupling agents such as $\gamma$-methacryloxypropyltrimethoxysilane, $\gamma$-methacryloxypropyltriethoxysilane, $\gamma$-methacryloxypropylmethydimethoxysilane, etc.; epoxy silane coupling agents such as $\beta$-(3,4-epoxycyclohexyl) ethyltrimethoxysilane, $\gamma$-glycidoxypropyltrimethoxysilane, etc.; mercapto silane coupling agents such as $\gamma$-mercaptopropyltrimethoxysilane, etc.; isocyanate silane coupling agents such as propyltriethoxysilane, $\gamma$-isocyanatopropyltrimethoxysilane, 1,3,5-N-trimethoxysilylpropyl) isocyanuate, etc.; polymer type silane coupling agents such as polyethoxydimethylsiloxane, etc.; cationic type silane coupling agents such as N-benzyl- β-aminoethyl)-γ-aminopropyltrimethoxysilane hydrochloride salt, etc.; silane monomers such as methyltriethoxysilane, methyltrimethoxysilane, etc.; polyether modified silane coupling agents such as n-hexyltriethoxysilane, n-octyltriethoxysilane, phenyltriethoxysilane, etc.; polyester modified silane coupling agents, etc.

(Resin component)

As the resin component of the prepregs of the present invention, there can be employed the resins used for the conventional glass cloth-based prepregs as well as the thermosetting resins used for the adhesive films or copper-foiled adhesive films containing no glass cloth. The "resin component" referred to herein is a blend of a resin (or resins), a curing agent, a curing accelerator, a coupling agent (optional) and a diluent (optional).

The resins used for the conventional glass cloth-based prepregs have per se no film forming properties, so that in case such resins are coated on one side of a copper foil to form an adhesive layer and half-cured after removing the solvent by heating, troubles such as cracking or chipping of resin tend to occur during transport, cutting, lamination, and other operations, and the interlayer insulating layers would be reduced in thickness abnormally at certain portions, such as the areas where the inner layer circuits are present, during hot pressure molding to give rise to troubles such as reduced interlayer insulation resistance or short-circuiting, so that it has been hardly possible to use these resins for the adhesive films having copper foils.

In the present invention, however, since the resin is reinforced with whiskers dispersed therein, the prepreg layer composed of the resin of this invention and whiskers is provided with film forming properties, and such troubles as cracking and chipping of resin scarcely take place in the steps of transport, cutting and lamination. Also, due to the presence of said whiskers, the interlayer insulating layers remain free from the phenomenon of abnormal decrease of thickness during hot pressure molding.

It is also practical to employ the resins which have conventionally been used for adhesive films or copper-foiled adhesive films. These resins have per se film forming properties as they contain high-molecular weight components, but dispersion of whiskers in these resins according to the present invention further enhances film forming properties and handling qualities of the resins as well as insulation reliability of the produced circuit boards. It is also possible to reduce the content of high-molecular weight components by an amount equivalent to the enhancement of film forming properties by dispersion of whiskers, and this may lead to the improvements of heat resistance or adhesiveness of the resin.

Preferred examples of the resins usable in the present invention include epoxy resins, bistriazine-maleimide resins, polyimide resins, phenol resins, melamine resins, silicon resins, unsaturated polyester resins, cyanate resins, isocyanate resins, and modified versions of these resins. Of these resins, bistriazine-maleimide resins and epoxy resins are especially preferred in view of the properties of the produced printed circiuit board. Preferred examples of epoxy resins for use in the present invention are bisphenol A epoxy resins, bisphenol F epoxy resins, bisphenol S epoxy resins, phenolic novolak epoxy resins, cresol novolak epoxy resins, bisphenol A novolak epoxy resins, salicylaldehyde novolak epoxy resins, bisphenol F novolak epoxy resins, alicyclic epoxy resins, glycidyl ester-based epoxy resins, glycidylamine-based epoxy resins, hydantoin-based epoxy resins, isocyanurate-based epoxy resins, alicyclic epoxy resins, their halides and hydrogenated products, and mixtures of these resins. Of these resins, bisphenol A novolak epoxy resins and salicylaldehyde novolak epoxy resins are especially preferred because of prominent heat resistance of these resins.

(Curing agents)

As the curing agent of these resins, all types of conventional curing agents can be used. In case the resin used is an epoxy resin, there can be used, for example, dicyandiamide, bisphenol A, bisphenol F, polyvinylphenol, phenolic novolak, bisphenol A novolak, and halides and hydrogenated products of these phenolic resins. Bisphenol A novolak is especially preferred because of its excellent heat resistance.

The ratio of the curing agent to the resin may be properly selected from the range commonly in use, but usually the ratio of the curing agent preferably falls within the range of 2 to 100 parts by weight, more preferably 2 to 5 parts by weight in the case of dicyandiamide and 30 to 80 parts by weight in the case of other types of curing agent, per 100 parts by weight of resin. When said ratio is less than 2 parts by weight, sufficient curing may not be attained, and when the ratio exceeds 100 parts by weight, the superfluous curing agent may remain in the cured product to impair its electrical properties.

(Curing accelerator)

As curing accelerator, imidazole compounds, organic phosphorus compounds, tertiary amines, quaternary ammonium salts and the like can be used in case the resin used is an expoxy resin. The ratio of curing accelerator to said resin may be the one commonly in use, but it is preferably in the range of 0.01 to 20 parts by weight, more preferably 0.1 to 10 parts by weight, per 100 parts by weight of the resin. If this ratio is less than 0.01 part by weight, curing is excessively retarded, while if the ratio exceeds 20 parts by weight, curing is so much promoted that the curing reaction becomes uncontrollable.

(Diluent)

The thermosetting resins of the present invention may be used as a varnish by diluting them with a solvent. The solvents usable for this purpose include acetone, methyl ethyl ketone, xylene, methyl isobutyl ketone, ethyl acetate, ethylene glycol monomethyl ether, methanol, ethanol, N,N-dimethylformamide, N,N-dimethylacetamide, and the like.

The ratio of diluent to said resin may be the one commonly in use; it is preferably in the range of 1 to 200 parts by weight, more preferably 30 to 100 parts by weight, per 100 parts by weight of the resin. If the diluent ratio is less than 1 part by weight, the diluent can not produce its normal effect, while if this ratio exceeds 200 parts by weight, the produced resin composition proves too low in viscosity for coating of the copper foils or carrier films.

(Other compounding agents)

In the present invention, beside the components described above, the other known and commonly used additives such as coupling agent, filler, flame retardant, etc., may be blended in the resin as desired.

(Whisker/resin ratio)

If the amount of electrical insulating whiskers blended in the resin is too small, such as less than 5 parts by weight per 100 parts by weight of resin solid, the handling qualities of the prepreg are deteriorated because, for one thing, the resin becomes liable to get broken finely and scattered when the prepreg is cut. Also, the produced wiring board proves unsatisfactory in rigidity. On the other hand, if the whisker amount blended is too large, such as exceeding 350 parts by weight, resin filling of the uneven parts of inner layer circuits or between circuits during hot pressure molding is adversely affected, and also voids or thin spots tend to form in the whisker-blended resin layer after molding, which may impair the quality of the produced wiring board. The amount of whiskers to be blended, therefore, preferably falls within the range of 5 to 350 parts by weight per 100 parts by weight of resin solids. The range of 30 to 230 parts by weight is more preferable because of expedited resin filling and also because the produced wiring board is provided with the same or higher level of rigidity, dimensional stability and wire bonding workability as compared with the wiring boards produced by using conventional glass cloth-based prepregs.

(Carrier film)

In the present invention, as carrier film on one side of which an insulating layer, viz a whisker-reinforced composite resin layer (B-staged), is to be formed, there can be used metal foils such as copper or aluminum foil, polyester film, polyimide film, or those of said metal foils or films whose surface has been treated with a release agent.

(Orientation of whiskers)

It is desirable that the whiskers in the insulating material composed of electrical insulating whiskers of the present invention and B-staged resin be arranged in a state close to two-dimensional alignment (a state where the axial direction of whiskers is close to parallel to the plane forming the insulating material layer). Such orientation of whiskers is a vital factor for realizing excellent handling qualities of the insulating material of this invention as well as high rigidity and good dimensional stability and surface flatness of the produced wiring board.

(Coating method)

Said orientation of whiskers can be effected by using whiskers having fiber length in the specified range and by employing a proper coating method such as blade coating, rod coating, knife coating, squeeze coating, reverse roll coating, transfer roll coating or the like, which is capable of loading shear force in the plane direction parallel to copper foil or loading compressive force in the direction orthogonal to the plane of copper foil when the whisker-blended resin varnish is applied on the copper foil.

As described above, in the first embodiment of the present invention, an ion adsorbent is added to resin varnish for elevating insulation reliability when the compounded insulating material containing electrical insulating whiskers is used for multilayer printed circuit boards.

Also, since fine whiskers having better laser workability than glass are used as base of the insulating layers made by using the insulating material of this invention, it is possible to easily perform laser drilling which was impossible with the insulating layers using conventional glass cloth-incorporated prepregs. This makes it possible to easily form interstitial via holes (IVH) of small sizes, such as less than 100 μm in diameter, and to make fine the circuitry of the printed circuit boards, which greatly contributes to the enhancement of packaging density and performance of electronic devices.

Second Embodiment of the Present Invention

The insulating varnish producing process according to the second embodiment of the present invention comprises refining the resin varnish containing electrical insulating whiskers by filtration. The electrical insulating whiskers used in the instant embodiment of the invention are ceramic whiskers, preferably the ones having an average diameter in the range of 0.3 to 3.0 μm and an average length of 3 to 50 μm. The filter used for filtration of resin varnish is preferably the one having an opening size of 50 to 100 μm, for example a 170- to 70-mesh Tyler screen.

The whiskers, resin(s), curing agent, curing accelerator, diluent, other compounding agents, whisker/resin ratio, carrier film, orientation of whiskers and coating method used in the second embodiment of the present invention are the same as described in the first embodiment of the invention.

The insulating varnish producing process according to the second embodiment of the present invention features elimination of the aggregates of electrical insulating whiskers greater than a specified size by regulation of filter mesh size. It is possible to enhance insulation reliability of the insulating material by inhibiting the whisker aggregates from existing in the whisker-blended insulating material at the stage of insulating varnish.

Also, since fine whiskers having better laser workability than glass are used as base of the insulating layers made by using the insulating material of the present invention, it is possible to easily perform laser drilling which was difficult with the insulating layers using conventional glass cloth-incorporated prepregs. This enables easy formation of IVH of small sizes, such as less than 100 μm in diameter, and fine circuitry of printed circuit boards, and greatly contributes to the enhancement of packaging density and performance of electronic devices.

Third Embodiment of the Present Invention

The insulating varnish producing process according to the third embodiment of the present invention comprises mixing and stirring electrical insulating whiskers showing cohesiveness in the dry state in an organic solvent to form a slurry, and blending this slurry in a resin varnish, followed by further stirring.

(Slurry)

The slurry used in the present invention is obtained by mixing whiskers in an organic solvent with stirring to dissociate the whisker aggregates in the mass of electrical insulating ceramic whiskers of the dry state. The organic solvent used for forming the slurry needs to be compatible with the resin varnish used, and is preferably of the same type as the solvent used for making the insulating varnish for stabilization of the insulating varnish. The solid content of this slurry is 20 to 80% by weight, preferably 25 to 50% by weight. If its content is less than 20% by weight, the resin varnish is overloaded with the solvent to make it unabale to perform normal coating of the insulating varnish, while if the solid content exceeds 80% by weight, the dispersing effect of electrical insulating whiskers becomes too feeble.

The whiskers, resins, curing agent, curing accelerator, diluent, other compounding agents, whisker/resin ratio, carrier film, whisker orientation and coating method used in the third embodiment of the invention are the same as described in the first embodiment of the invention.

Thus, the third embodiment of the present invention is an insulating varnish producing process featuring addition, to a resin varnish, of electrical insulating whiskers in the form of a slurry in an organic solvent, and mixing thereof with stirring. According to this embodiment, since there exist no aggregates of electrical insulating whiskers in the insulating varnish, it is possible to elevate insulating reliability of the adhesive films containing said whiskers.

Further, since fine whiskers having better laser workability than glass are used as base of the insulating layer made by using the adhesive film of the present invention, it is possible to easily perform laser drilling which was difficult with the insulating layers using the conventional glass cloth-based prepregs. This makes it possible to easily form IVH of small sizes, such as less than 100 μm in diameter, and to work fine circuitry on printed circuit boards, thus greatly contributing to the enhancement of packaging density and performance of electronic devices.

Fourth Embodiment of the Present Invention

The insulating varnish producing process according to fourth embodiment of the present invention comprises preparing a slurry of electrical insulating whiskers in a resin varnish, and milling the slurry by a beads mill.

The electrical insulating whiskers used for forming the slurry are ceramic whiskers having an average diameter in the range of 0.3 to 3.0 μm and an average length in the range of 3 to 50 μm.

An insulating material obtained by coating said insulating varnish on a copper foil or carrier film is laminated with the interlayer substrates having inner layer circuits therein, and then circuits are formed on the outer layer side and electrically connected to the corresponding inner layer circuits to constitute a multilayer circuit board.

(Beads mill)

The beads mill used in the present invention is preferably made of ceramic and capable of preventing inclusion of foreign materials during milling of the insulating varnish blended with electrical insulating ceramic whiskers.

It is recommended to use a ceramic beads mill whose interior surface has been coated with zirconia of high hardness and which contains zirconia beads therein, as this type of beads mill is highly proof against scratches or exfoliation when used for milling electrical insulating whiskers and also scarcely allows inclusion of foreign materials in the insulating varnish.

The bead size is not specified in the present invention, but it preferably falls within the range of 300 μm to 2 mm in diameter. If the bead diameter is less than 300 μm, the aggregate elimination efficiency from the insulating varnish by a filter is low, resulting in a large loss of insulating varnish and a reduced elimination rate. If the bead diameter is greater than 2 mm, the frequency of impingement of beads against whiskers reduces, resulting in a lowered milling efficiency.

The whiskers, resins, curing agent, curing accelerator, diluent, other compounding agents, whisker/resin ratio, carrier film, means of whisker orientation and coating method used in the fourth embodiment of the invention are the same as described in the first embodiment of the invention.

Thus, the insulating varnish producing process according to the fourth embodiment of the present invention features bead milling of a slurry of electrical insulating whiskers in a resin varnish. According to this process, dispersibility of electrical insulating whiskers in insulating varnish is improved and also entanglement of whiskers with each other is minimized as these whiskers are shortened in average length. Further, since no aggregates of whiskers are contained in the insulating varnish, it is possible to enhance insulation reliability of the insulating material blended with said whiskers.

Moreover, since fine whiskers having better laser workability than glass are used as base of the insulating layer made by using the insulating material of the present invention, it is possible to easily perform laser drilling which has been difficult with the insulating layers using the conventional glass cloth-based prepregs. This enables easy formation of IVH of small sizes, such as less than 100 μm in diameter, and fine circuitry on the printed circuit boards, which greatly contributes to the enhancement of packaging density and performance of electronic devices.

Fifth Embodiment of the Present Invention

The insulating varnish producing process according to the fifth embodiment of the present invention comprises preparing a slurry of electrical insulating whiskers in a resin varnish by stirring, and milling this slurry by a three-roll mill.

The rolls of the three-roll mill may be made of ceramic material. Also, as the electrical insulating whiskers to be milled by said three-roll mill, there can be used ceramic whiskers having an average diameter in the range of 0.3 to 3 μm and an average length in the range of 3 to 50 μm.

The adhesive films obtained by coating said insulating varnish on copper foils or carrier films are laminated with interlayer substrates having inner layer circuits formed therein, and then circuits are formed on the outer layer surface and electrically connected to the corresponding inner layer circuits to constitute a multilayer printed circuit board.

(Three-roll mill)

The rolls of the three-roll mill used in the present invention are preferably made of ceramic material, and it is essential that said mill is of a structure which is capable of inhibiting mixing of foreign materials into insulating varnish during milling of said varnish blended with said electrical insulating whiskers.

Use of high-hardness zirconia- or alumina-made rolls for said three-roll mill is preferred as such rolls are highly proof against scratches or exfoliation during milling of said ceramic whiskers and also effective for preventing mixing of foreign materials into the insulating varnish.

It is desirable to produce insulating varnish under such milling conditions that won't cause break of electrical insulating whiskers during milling and allow maintenance of their average length during compounding, as this operation causes no rise of varnish viscosity and is easy to perform.

The whiskers, resins, curing agent, curing accelerator, diluent, other compounding agents, whisker/resin rate, carrier film, means of whisker orientation and coating method used in the fifth embodiment of the invention are the same as described in the first embodiment of the invention.

Thus, the fifth embodiment of the present invention is an insulating varnish producing process featuring milling of electrical insulating whiskers in a slurry thereof with a resin varnish by using a three-roll mill. According to this process, the risk of electrical insulating whiskers getting entanbled with each other is minimized because of improved dispersibility of whiskers in insulating varnish and reduced average length of whiskers, and also no aggregates of whiskers are contained in insulating varnish, so that insulation reliability of the adhesive films containing said electrical insulating whiskers is enhanced.

Further, since fine whiskers having better laser workability than glass are used as base of the insulating layers made by using the adhesive films of the present invention, it is easy to perform laser drilling which has been difficult with the insulating layers using the conventional glass cloth-based prepregs. This enables easy formation of IVHI of small sizes, such as less than 100 μm in diameter, and fine circuitry on the printed circuit boards, which greatly contributes to the enhancement of packaging density and performance of electronic devices.

Sixth Embodiment of the Present Invention

It is known that defective insulation seen in multilayer printed circuit boards made by using conventional electrical insulating whiskers is attributable to the improper diffusion of whiskers in insulating varnish or the presence of the area(s) where adhesion at the interface between electrical insulating whiskers and resin (hereinafter referred to simply as interface) is imperfect, causing advancement of water diffusion through this interface to encourage elution of copper of the copper foils by the action of ionic impurities in the insulating layers.

As means of improving filler dispersibility and adhesion at the interface, use of fillers which have been surface treated with an appropriate treatment such as a coupling agent is suggested. However, these surface treated fillers are costly, and the types of commercially available surface-treated fillers are very limited, so that it has been difficult to obtain a treated filler suited for a particular resin formulation.

Surface treatment of fillers is usually conducted by immersing fillers in a diluted solution of treating agent, or spraying this solution to fillers, and then drying by heating. The drying step, however, involves some serious problems. For instance, the coupling agent may be oligomerized to form a physical adsorptive layer on the treated filler surface. Also, since fillers tend to aggregate and hence need to be pulverized when blended in a varnish, a nonuniform treated layer may be formed on the filler surface. Such a physical adsorptive layer or nonuniform treated layer is responsible for unsatisfactory adhesion at the interface of the produced laminate.

As a solution to these problems, JP-A-61-272243 proposes direct addition of a coupling agent during varnish compounding. This method is capable of preventing aggregation of fillers to some extent because of high varnish viscosity provided by resin blend, but it still had the problem that the coupling agent is not uniformly oriented selectively on the filler surface, making it unable to obtain satisfactory interface adhesion.

The sixth embodiment of the present invention can overcome the above prior art problems. Specifically, according to this embodiment, in production of insulating varnishes blended with electrical insulating whiskers, dispersibility of whiskers is improved to better appearance of the product, and also adhesion at the interface of the produced multilayer printed circuit boards is improved. Thus this embodiment provides an insulating varnish with enhanced insulation reliability and reduced thermal expansion coefficient.

The insulating varnish producing process according to the sixth embodiment of the present invention comprises blending component resins, an ion adsorbent or an organic in a solution composed of electrical insulating whiskers and a treating solution for treating the whisker surfaces.
(Treating solution)

Solutions of coupling agents can be used as solvent solution in the instant embodiment of the present invention. The coupling agents usable here include silane coupling agents and titanate coupling agents, the former including epoxysilane type, aminosilane type, cationic silane type, vinylsilane type, acrylsilane type, mercaptosilane type and their composites. All types of additives commonly employed for this purpose may be used, and the amount thereof blended is not specifically defined.

In the sixth embodiment of the present invention, silicone oligomers can be used in place of conventional coupling agents for acquiring higher adhesion at the interface. The silicone oligomers usable here are not specified with regard to molecular weight and skeleton as far as such oligomers have a structure comprising 2 or more siloxane recurring units and having at the molecular chain terminal at least one functional group reactable with hydroxyl group in the substrate surface. The number of the siloxane recurring units is preferably 2 to about 70. A greater number of siloxane recurring units tends to cause nonuniform treatment and consequent reduction of heat resistance.

$R_2SiO_{2/2}$, $RSiO_{3/2}$ and $SiO_{4/2}$ of the bifunctional, trifunctional and tetrafunctional siloxane units signify the following structures, respectively:

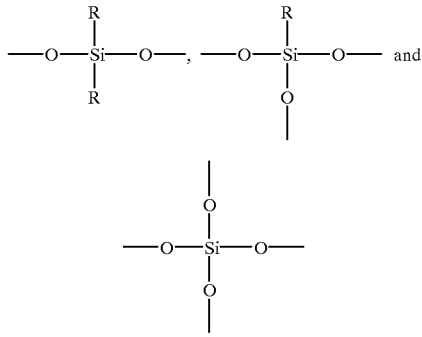

wherein R's are the same or different organic groups such as, for instance, methyl, ethyl, phenyl and vinyl.

The functional groups reactable with hydroxyl group in the silicone oligomer base surface and usable in this invention are not limited, but alkoxyl group and silanol group are generally used and preferred. The silicone oligomer used in this invention preferably has at least one bifunctional, trifunctional or tetrafunctional siloxne unit in the molecule, and it is more preferable that 15 mol % or more of the whole oligomer is constituted by tetrafunctional siloxane units. Such silicone oligomers can be used in combination with said coupling agent and/or other additives. The type and amount of the silicone oligomer used in combination with said additives are not limited in the present invention.

In the sixth embodiment of the present invention, a solvent is used for diluting said treating solution. The solvents usable here include, though not limited to, acetone, methyl ethyl ketone, toluene, xylene, methyl isobutyl ketone, ethyl acetate, ethylene glycol monomethyl ether, N,N-dimethylformamide, methanol and ethanol. These solvents may be used either singly or as a mixture of two or more of them.

The solids concentration of said solvent solution is not limited but can be properly changed according to the type of the treating agent used, adsorption on the filler and other factors, but it is preferably in the range of 0.1 to 50% by weight. If the solids concentration is less than 0.1% by weight, the desired effect of surface treatment may not be provided, and if the solids concentration exceeds 50% by weight, heat resistance of the product tends to lower.
(Treating conditions)

The sixth embodiment of the present invention features blending of the resin component without undergoing the drying step but directly after treatment of filler in the solvent solution to prepare a varnish. In this operation, treating temperature and treating time are not subject to restrictions but can be properly adjusted according to the type of the filler and treating agent used, adsorption on the filler and other factors, but usually the treatment is preferably carried out at a temperature between room temperature and 80° C. for at least 30 minutes.

The whiskers, resins, curing agent, curing accelerator, diluent, ion adsorbent, organic copper harm preventive, other compounding agents, whisker/resin ratio, carrier film, means of whisker orientation and coating method used in the sixth embodiment of the present invention are the same as described in the first embodiment of the invention.

(Mixing)

For improving dispersibility of insulating whiskers, mixing may be conducted by combining different means of mixing, such as mixing by attritor, mixing by three-roll mill and mixing by beads mill, after preparation of insulating varnish. After mixing, it is desirable to remove air bubbles in the varnish by suitable means such as stirring deaeration under reduced pressure.

According to the sixth embodiment of the present invention described above, since the resin component is blended directly in the solution used for treating the surfaces of electrical insulating whiskers, with no drying step involved after filler treatment, whiskers can be dispersed uniformly in the varnish without forming aggregates, allowing formation of a uniform layer of treating agent on the whisker surfaces. Also, compatibility with resin is improved and further, interface adhesion is enhanced. It is thus possible to realize high insulation reliability and low expansion coefficient by using the insulating material blended with electrical insulating whiskers produced according to the method of the sixth embodiment of the present invention as material of multilayer printed circuit boards.

Also, since fine whiskers having better laser workability than glass are used as base material of the insulating layers made by using the insulating material according to the sixth embodiment of the present invention, it is possible to easily perform laser drilling which has been difficult with the insulating layers using conventional glass cloth-based prepregs. This enables easy formation of IVH of small sizes, such as less than 100 $\mu$m in diameter, and fine circuitry on the printed circuit boards, which greatly contributes to the enhancement of packaging density and performance of electronic devices.

The present invention will be further illustrated by the following Examples.

EXAMPLE 1

(Varnish)

In a thermosetting resin comprising 70 parts by weight of a bisphenol A novolak epoxy resin (molecular weight: 1,200; exopy equivalent: 206), 30 parts by weight of a bisphenol A novolak resin (molecular weight: 700; hydroxyl equivalent: 118), 0.5 part by weight of 2-ethyl-4-methylimidazole which is a curing accelerator, and 50 parts by weight of methyl ethyl ketone, aluminum borate whiskers having an average diameter of 0.8 $\mu$m and an average fiber length of 20 $\mu$m were blended in an amount of 90 parts by weight per 100 parts by weight of resin solids. Then an atimony-bismuth-based compound was added as ion adsorbent in an amount of 2 parts by weight per 100 parts by weight of resin solids, and the mixture was stirred until the aluminum borate whiskers were uniformly dispersed in the varnish.

(Adhesive film)

The thus obtained insulating varnish was knife coated on the 18 $\mu$m thick copper foils and 50 $\mu$m thick polyethylene terephthalate (PET) films, and dried by heating at 150° C. for 10 minutes to half-cure the resin while removing the solvent to make the copper-foiled adhesive films having an adhesive layer thickness of 50 $\mu$m and 100 $\mu$m and the PET film-attached adhesive films having an adhesive layer thickness of 50 $\mu$m and 100 $\mu$m. PET film was stripped off from the PET film-attached adhesive films to obtain the 50 $\mu$m and 100 $\mu$m thick adhesive films comprising whiskers and half-cured epoxy resins with a whisker volume fraction of 30%.

The copper-foiled adhesive films could be cut clean without causing scattering of resin by a cutting knife and shears. These adhesive films were also free from blocking and had good handling qualities. The adhesive films made by coating said insulating varnish on PET films suffered no trouble such as break during separation of PET film and normal handling, could be cut clear without causing scattering of resin by a cutting knife and shears, kept free from blocking and had good handling qualities.

(Galvanic corrosion test)

The unnecessary portion of the copper foil of a 0.8 mm thick double-sided copper-clad glass-reinforced epoxy resin laminate was etched away to form a pattern which was to provide an inner layer electrode for the galvanic corrosion test. On both sides thereof were laminated the previously made copper-foiled adhesive films having an adhesive layer thickness of 50 $\mu$m in such a manner that the adhesive layer would contact the electrode pattern, followed by hot pressure molding under the conditions of 170° C., 2.5 MPa and 60 minutes.

The portion of the resulting laminate which was positioned in registration with said inner layer electrode pattern was etched to form a pattern which was to provide an outer layer electrode, thus making a galvanic corrosion test piece. 50 V was applied across these inner and outer layer electrodes and the test piece was left in an atmosphere of 85° C. and 85% RH for 1,000 hours, after which insulation resistance of the test piece was measured. The result showed high insulation resistance of over $10^9$ $\Omega$ and confirmed excellent galvanic corrosion resistance of the adhesive films.

(Bending or flexural modulus)

Said 100 $\mu$m thick adhesive film was sandwiched between a pair of 18 $\mu$m thick single-sided roughened copper foils so that the roughened side of each copper foil would face the adhesive film, and hot pressure molded under the conditions of 170° C., 2.5 MPa and 60 minutes. The copper foils of the obtained copper-clad laminate were etched away and the bending modulus of the laminate was measured b a three-point bending test. It was 20 GPa (average of measurements in the longitudinal and transverse directions, without copper foil).

(Drilling accuracy)

10 pieces of said copper-clad laminate were accumulated and drilled by a 0.3 mm$\phi$ drill, and positional discrepancy between the formed holes in the top and bottom laminates was measured. It was less than 20 $\mu$m.

(Multilayer printed circuit board)

The unnecessary portion of the copper foil of said copper-clad laminate was etched away to form circuits, and both sides of this laminate were overlaid with the previously produced 50 $\mu$m thick insulating material. On the outside thereof was further placed an 18 $\mu$m thick single-sided roughened copper foil so that its roughened side would face the insulating material, and the assembly was hot pressure molded under the conditions of 170° C., 2.5 MPa and 60 minutes to produce a multilayer copper-clad laminate having inner layer circuits formed therein.

Surface roughness of this multilayer copper-clad laminate having inner layer circuits was measured by a feeler type surface roughness tester. As a result, at the location of measurement on the outer layer surface on a 25 mm long straight line including the portion where inner layer cirucit was present immediately therebelow and the portion where no inner layer circuit was present, the 10-point average of level difference between said circuit-holding portion and no-circuit portion was less than 3 $\mu$m, which corroborated that the laminate had good surface flatness well suited for circuit working.

A predetermined position of the surface copper foil of said multilayer copper-clad laminate having inner layer circuit was etched away to form a 75 μm-diameter opening, and this opening was drilled by using an impact laser manufactured by Sumitomo Heavy Industries, Ltd. to form a hole reaching the inner layer circuit in the cured adhesive film. This was followed by a smearing treatment with permanganic acid, electroless plating, formation of an etching resist pattern and removal of the unnecessary portion thereof to form outer layer circuits.

On both sides of this multilayer printed circit board was placed the previously produced 50 μm thick adhesive film, and on the outside thereof was further placed an 18 μm thick single-sided roughened copper foil so that its roughened side would face the adhesive film, followed by hot pressure molding under the conditions of 170° C., 2.5 MPa and 60 minutes to make a 6-layer copper-clad laminate having inner layer circuits. A predetermined position of the surface copper foil of this laminate was etched away to form a 75 μm-diameter opening, and this opening was drilled by using an impact laser mfd. by Sumitomo Heavy Industries, Ltd., followed by smearing treatment with permanganic acid, electroless plating, formation of an etching resist pattern and removal of unnecessary copper by etching to form outer layer circuits. The above operations were repeated to make a 10-layer printed circuit board.

(Test of multilayer printed circuit board)

A part of this multilayer printed circuit board was cut out and its thermal expansion coefficient and bending modulus were measured. Thermal expansion coefficient was measured according to TMA and bending modulus according to DMA in the bending mode. The mean thermal expansion coefficient of the longitudinal and transverse directions was 10 ppm/° C. (at normal temperature), and the mean bending modulus of the longitudinal and transverse directions was 60 GPa at normal temperature and 40 GPa at an elevated temperature (200° C.). The surface hardness of the laminate measured by a Barcol hardness tester was 65 at normal temperature and 50 at an elevated temperature (200° C.).

(Wiring bonding workability)

Bare chips were mounted at a part of the 10-layer printed circuit board and connected to surface circuits by wire bonding. Wire bonding was conducted under the following conditions: ultrasonic output=1 W; ultrasonic output duration=50 μs; bonding load=100 g; wire bonding temperature=180° C. This wire bonding operation could be performed in a satisfactory way.

(Thermal shock test)

8 mm×20 mm IC chips (TSOP) were mounted on the 10-layer printed circuit board and connected to surface circuits by solder, and this IC chip (TSOP)-mounted substrate board was subjected to a cyclic thermal shock test with each test cycle consisting of 30-minute exposure to a −65° C. atmosphere and another 30-minute exposure to a 150° C. atmosphere. No trouble such as break or disconnection occurred at the solder joints even after 2,000 cooling-heating cycles.

Also, no trouble such as break or disconnection was seen in the conduction test of the circuits including interstitial via holes in the board.

EXAMPLE 2

(Varnish)

In a thermosetting resin comprising 70 parts by weight of a salicylaldehyde novolak epoxy resin (molecular weight: 1,000; epoxy equivalent: 180), 30 parts by weight of a bisphenol A novolak resin (molecular weight: 700; hydroxyl equivalent: 116), 0.5 part by weight of 2-ethyl-4-methylimidazole as curing accelerator and 50 parts by weight of methyl ethyl ketone, the aluminum borate whiskers having an average diameter of 0.8 μm and an average fiber length of 20 μm were blended in an amount of 90 parts by weight per 100 parts by weight of resin solids. To this mixture was further added a hindered phenolic copper harm preventive as an ion adsorbent in an amount of 3 parts by weight per 100 parts by weight of resin solids, and the mixture was stirred until aluminum borate whiskers were uniformly dispersed in the varnish.

(Adhesive film)

The thus produced insulating varnish was knife coated on the 18 μm thick copper foils and 50 μm thick PET film sand dried by heating at 150° C. for 10 minutes to half-cure the resin while removing the solvent to make the copper-foiled adhesive films having an adhesive layer thickness of 50 μm and 100 μm, and the PET film-attached adhesive films having an adhesive layer thickness of 50 μm and 100 μm. Then PET film was peeled off from the PET film-attached adhesive films to obtain the 50 μm and 100 μm thick adhesive films comprising whiskers and half-cured epoxy resins with a whisker volume fraction of 30%.

The copper-foiled adhesive films could be cut clean without causing scattering of resin by a cutting knife and shears, kept free from blocking with each other and had good handling qualities. Also, the adhesive films produced by coating PET films with said varnish suffered no trouble such as break during peeling of PET film or normal handling, could be cut clean without causing resin scattering by a cutting knife and shears, kept free from blocking and showed good handling qualities.

(Galvanic corrosion test)

Galvanic corrosion test pieces were made and their insulation resistance was determined in the same way as in Example 1. The test pieces showed high insulation resistance of over $10^9$ Ω and confirmed excellent galvanic corrosion resistance of said insulating material.

(Bending modulus)

Test pieces were made and their bending modulus was measured by a three-point bending test in the same way as in Example 1. The test pieces showed bending modulus of 20 GPa (average of measurements in the longitudinal and transverse directions, without copper foil).

(Drilling accuracy)

Positional discrepancy between the holes in the top and bottom laminates of a drilled 10-piece accumulation of said copper-clad laminates, measured in the same way as in Example 1, was less than 20 μm.

(Multilayer printed circuit board)

A multilayer copper-clad laminate having inner layer circuits was made in the same way as in Example 1.

Surface roughness of this multilayer copper-clad laminate was measured by a feeler type surface roughness tester. At the location of measurement on the outer layer surface on a 25 mm long straight line including the portion where inner layer circuit was present immediately therebelow and the portion where no inner layer circuit was present, the 10-point average of level difference between the circuit-having portion and the no-circuit portion was less than 3 μm, indicating that said laminate had excellent surface flatness suited for circuit working.

Using this multilayer copper-clad laminate having inner layer circuits, a 10-layer printed circuit board was made by following the same procedure as in Example 1.

(Test of multilayer printed circuit board)

A part of this 10-layer printed circuit board was cut out and its thermal expansion coefficient and bending modulus were determined. Thermal expansion coefficient was measured according to TMA and bending modulus was measured according to DMA in the bending mode. The mean thermal expansion coefficient of the longitudinal and transverse directions was 10 ppm/° C. (at normal temperature), and the mean bending modulus of the longitudinal and transverse directions was 60 GPa at normal temperature and 50 GPa at an elevated temperature (200 ° C.). Barcol surface hardness was 65 at normal temperature and 55 at an elevated temperature (200° C.).

(Wire bonding workability)

Wire bonding was conducted in the same way as in Example 1 except for use of IC chips in place of bare chips. It was possible to accomplish desired wire bonding in a well satisfactory way.

(Thermal shock test)

Result of the thermal shock test conducted on the 10-layer printed circuit board in the same way as in Example 1 showed no occurrence of trouble such as disconnection at the solder joints even after 2,000 test cycles. Also, no trouble such as disconnection was observed in the conduction test of the circuits including interstitial via holes in the board.

COMPARATIVE EXAMPLE 1

(Varnish)

In a thermosetting resin comprising 70 parts by weight of a bisphenol A novolak epoxy resin (molecular weight: 1,200; epoxy equivalent: 208), 30 parts by weight of a bisphenol A novolak resin (molecular weight: 700; hydroxyl equivalent: 118), 0.5 part by weight of 2-ethyl-4-methylimidazole as curing accelerator and 50 parts by weight of methyl ethyl ketone, the aluminum borate whiskers having an average diameter of 0.8 $\mu$m and an average fiber length of 20 $\mu$m were blended in an amount of 90 parts by weight per 100 parts by weight of resin solids, and the mixture was stirred until whiskers were uniformly dispersed in the varnish.

(Adhesive film)

This insulating varnish was knife coated on the 18 $\mu$m thick copper foils and 50 $\mu$m thick PET films and dried by heating at 150° C. for 10 minutes to half-cure the resin while removing the solvent to make the copper-foiled adhesive films having an adhesive layer thickness of 50 $\mu$m and 100 $\mu$m, and the PET film-attached adhesive films having an adhesive layer thickness of 50 $\mu$m and 100 $\mu$m. PET film was stripped off from the PET film-attached adhesive films to obtain the 50 $\mu$m and 100 $\mu$m thick adhesive films comprising whiskers and half-cured epoxy resins with a whisker volume fraction of 30%.

The thus obtained copper-foiled adhesive films could be cut clean without causing scattering of resin by a cutting knife and shears, kept free from blocking with each other and had good handling qualities. Also, the adhesive films made by coating said varnish on PET films had no trouble such break during separation of PET film and normal handling, could be cut clean without causing scattering of resin by a cutting knife and shears, kept free from blocking and had good handling qualities.

(Galvanic corrosion test)

A galvanic corrosion test piece was made using said 50 $\mu$m adhesive film in the same way as in Example 1, and the change with time of this test piece was examined by leaving it in an atmosphere of 85° C. and 85% RH. Insulation resistance of this test piece after left in said atmosphere for 250 hours was less than $10^9$ Ω, indicating poor galvanic corrosion resistance of the adhesive film.

(Bending modulus)

A copper-clad laminate was made using said adhesive film in the same way as in Example 1 and its bending modulus was measured by a three-point bending test. It was 20 GPa (average of measurements in the longitudinal and transverse directions, without copper foil).

(Drilling accuracy)

Positional discrepancy between the holes in the top and bottom laminates in a drilled 10-piece assembly of said copper-clad laminates made in the same way as in Example 1 was less than 20 $\mu$m.

(Multilayer printed circuit board)

A multilayer copper-clad laminate having inner layer circuits was made in the same way as in Example 1, and surface roughness of this copper-clad laminate was measured by a feeler type surface roughness tester. At the location of measurement on the outer layer surface on a 25 mm long straight line including the portion where inner layer circuit was present immediately therebelow and portion where no such circuit was present, the 10-point average of level difference between said circuit-holding portion and no-circuit portion was less than 3 $\mu$m, indicating good surface flatness suited for circuit working of this laminate.

Using this multilayer copper-clad laminate having inner layer circuits, a 10-layer printed circuit board was made in the same way as in Example 1.

(Test of multilayer printed circuit board)

A part of this multilayer printed circuit board was cut out and its thermal expansion coefficient and bending modulus were determined according to TMA and bending mode DMA, respectively. The mean thermal expansion coefficient of the longitudinal and transverse directions was 10 ppm/° C. (at normal temperature) and the mean bending modulus of the longitudinal and transverse directions was 60 GPa at normal temperature and 40 GPa at an elevated temperature (200° C.). Barcol surface hardness of the board was 65 at normal temperature and 50 at an elevated temperature (200° C.).

(Wire bonding workability)

Wire bonding could be conducted in a satisfactory way with this circuit board in accordance with the method of Example 1.

(Thermal shock test)

In the thermal shock test conducted in the same way as in Example 1, no trouble such as disconnection occurred at solder joints even after 2,000 test cycles. Also, no trouble such as disconnection was observed in the conduction test of the circuits including interstitial via holes in the board.

COMPARATIVE EXAMPLE 2

(Prepreg)

A thermosetting resin comprising 70 parts by weight of a bisphenol A novolak epoxy resin (molecular weight: 1,200; epoxy equivalent: 200), 30 parts by weight of a bisphenol A novolak resin (molecular weight: 700; hydroxyl equivalent: 118), 0.5 part by weight of 2-ethyl-4-methylimidazole as curing accelerator and 50 parts by weight of methyl ethyl ketone was impregnated in a 50 $\mu$m thick glass cloth and a 100 $\mu$m thick glass cloth and dried by heating at 150° C. for 10 minutes to half-cure the resin while removing the solvent to obtain the 50 $\mu$m and 100 $\mu$m thick glass-reinforced epoxy prepregs.

These prepregs, when cut by a cutting knife and shears, caused no scattering of resin.

(Galvanic corrosion test)

Insulation resistance of the galvanic corrosion test pieces made in the same way as in Example 1 by using said 50 $\mu$m thick glass-reinforced epoxy prepreg was higher than $10^9$ Ω, corroborating excellent galvanic corrosion resistance of this adhesive film.

(Bending modulus)

Bending modulus of the copper-clad laminate made in the same way as in Example 1 by using said 100 $\mu$m thick glass-reinforced epoxy prepreg, as measured by a three-point bending test, was 8 GPa (average of measurements in the longitudinal and transverse directions, without copper foil).
(Drilling accuracy)

Positional discrepancy between the holes in the top and bottom laminates of a drilled 10-piece accumulation of said copper-clad laminates made in the same way as in Example 1 was greater than 50 µm.
(Multilayer printed circuit board)

Using said copper-clad laminate, a multilayer copper-clad laminate having inner layer circuits was made in the same way as in Example 1, and its surface roughness was measured by a feeler type surface roughness tester. At the location of measurement on the outer layer surface on a 25 mm straight line including the portion where inner layer circuit was present immediately therebelow and the portion having no such circuit therebelow, the 10-point average of level difference between said circuit-holding portion and no-circuit portion was greater than 8 µm.

A predetermined position of the surface copper foil of said multilayer copper-clad laminate having inner layer circuits was etched away to form a 75 µm-diameter opening, and it was tried to drill this opening by an impact laser mfd. by Sumitomo Heavy Industries, Ltd. but the glass portion could not be removed.

COMPARATIVE EXAMPLE 3
(Adhesive film)

A thermosetting resin comprising 30 parts by weight of a high-molecular weight epoxy polymer having a weight-average molecular weight of 50,000, 70 parts by weight of a bisphenol A epoxy resin (molecular weight: 400; epoxy equivalent: 180), 0.2 equivalent of a phenolic resin masked diisocyanate as crosslinking agent of said high-molecular weight epoxy polymer and 0.5 part by weight of 2-ethyl-4-methylimidazole as curing agent was knife coated on an 18 µm thick copper foil and a 50 µm thick PET film and dried by heating at 150° C. for 10 minutes to half-cure the resins while removing the solvent to make a copper-foiled adhesive film having an adhesive layer thickness of 50 µm and a PET film-attached adhesive film having an adhesive layer thickness of 50 µm. PET film was peeled off from the PET film-attached adhesive film to obtain a 50 µm thick adhesive film.

This adhesive film suffered no trouble such as break during peeling of PET film and normal handling and could be cut clean without causing scattering of resin by a cutting knife and shears, but this adhesive film was liable to blocking and poor in handling qualities.
(Galvanic corrosion test)

Insulation resistance of the galvanic corrosion test pieces made by using said copper-foiled adhesive film having a 50 µm thick insulating layer in the same way as in Example 1 was higher than $10^9$ Ω, indicating excellent galvanic corrosion resistance of this adhesive film.
(Multilayer printed circuit board)

Said 50 µm thick adhesive film was placed overlaying both sides of the interlayer substrate made in Comparative Example 1, and then an 18 µm thick single-side roughened copper foil was placed on the outside of each adhesive film so that the roughened side of the copper foil would face the adhesive film, followed by hot pressure molding under the conditions of 170° C., 2.5 MPa and 60 minutes to make a multilayer copper-clad laminate having inner layer circuits, and its surface roughness was measured by a feeler type surface roughness tester. At the location of measurement on the outerlayer surface on a 25 mm straight line including the portion where inner layer circuit was present immediately therebelow and the portion where no such circuit was present, the 10-point average of level difference between said two portions was less than 3 µm, which warranted good surface flatness suited for circu working of this laminate.

Using this multilayer copper-clad laminate having inner layer circuits, a 10-layer printed circuit board was made in the same way as in Example 1.
(Test of multilayer printed circuit board)

A part of this multilayer printed circuit board was cut out and its thermal expansion coefficient and bending modulus were measured according to TMA and bending mode DMA, respectively. The mean thermal expansion coefficient of the longitudinal and transverse directions was 30 ppm/° C. (at normal temperature) and the mean bending modulus of the longitudinal and transverse directions was 20 GPa at normal temperature and 10 GPa at an elevated temperature (200° C.). Barcol hardness of the laminate was 30 at normal temperature and 10 at an elevated temperature (200° C.).
(Wire bonding workability)

Bare chips were mounted at a part of said 10-layer printed circuit board and connected to surface circuits by wire bonding under the conditions of: ultrasonic output1 W; ultrasonic output duration=50 µs; bonding load=100 g. Separation of wire occurred even when wire bonding temperature was lowered to 100° C.
(Thermal shock test)

In the thermal shock test of said 10-layer printed circuit board conducted in the same way as in Example 1, disconnection occurred at solder joints after around 100 test cycles. Disconnection was also seen in the conduction test of the circuits including interstitital via holes in the board.

As described above, the insulating varnish according to the first embodiment of the present invention, in which an ion adsorbent has been added, is capable of elevating insulation reliability of multilayer printed circuit boards using the adhesive films blended with electrical insulating whiskers.

The adhesive film obtained by using the insulating varnish produced according to the first embodiment of the present invention has made it possible to mold epoxy resins into sheets or sheet-like articles owing to the addition of electrical insulating whiskers, and the printed circuit boards produced by using said adhesive films have high surface flatness, hence good circuit workability, and are also credited with high packaging reliability because of high rigidity, good wire bonding workability because of high surface hardness, and excellent dimensional stability because of small thermal expansion coefficient. Thus, this embodiment of the present invention greatly contributes to the realization of higher packaging density, smaller thickness, higher reliability and lower cost of multilayer printed circuit boards.

EXAMPLE 3
(Insulating varnish)

In a resin varnish comprising 70 parts by weight of a bisphenol A novolak epoxy resin (molecular weight: 1,200; epoxy equivalent: 206), 30 parts by weight of a bisphenol A novolak resin (molecular weight: 600; hydorxyl equivalent: 118), 0.5 part by weight of 2-ethyl-4-methylimidazole and 70 parts by weight of methyl ethyl ketone, the aluminum borate whiskers having an average diameter of 0.8 µm and an average fiber length of 20 µm were blended in an amount of 90 parts by weight per 100 parts by weight of resin solids, and the mixture was stirred until aluminum borate whiskers were uniformly dispersed in the varnish. This dispersion was passed through a 200-mesh nylon filter to remove the whisker aggregates having a size greater than 50 µm.

(Adhesive film)

The resulting insulating varnish cleared of whisker aggregates with the sizes greater than 50 μm was knife coated on the 18 μm thick copper foils and the 50 μm thick PET films and dried by heating at 150° C. for 10 minutes to half-cure the resins while removing the solvent to form the copper-foiled adhesive films having an adhesive layer thickness 50 μm and 100 μm, and the PET film-attached adhesive films having an adhesive layer thickness of 50 μm and 100 μm. PET film was peeled off from said PET film-attached adhesive films to obtain the 50 μm and 100 μm thick adhesive films comprising whiskers and half-cured epoxy resins with a whisker volume fraction of 30%.

The copper-foiled adhesive films could be cut clean without causing scattering of resin by a cutting knife and shears, were free from blocking with each other and had good handling qualities. Also, the adhesive films made by coating said insulating varnish on PET films suffered no trouble such as break during peeling of PET film and normal handling, could be cut clean without causing scattering of resin, showed no liability to blocking and had good handling qualities.

(Galvanic corrosion test)

Insulation resistance of the galvanic corrosion test pieces made by using said copper-foiled adhesive film having an adhesive layer thickness of 50 μm in the same way as in Example 1 was greater than $10^9$ Ω, which endorsed excellent galvanic corrosion resistance of said adhesive film.

(Bending modulus)

Bending modulus of the copper-clad laminate made by using said 100 μm thick adhesive film in the same way as in Example 1, as measured by a three-point bending test, was 20 GPa (average of measurements in the longitudinal and transverse directions, without copper foil).

(Drilling accuracy)

Positional discrepancy between the holes in the top and bottom laminates of a 0.3 mmφ-drilled 10-piece assembly of said copper-clad laminates made in the same way as in Example 1 was less than 20 μm.

(Multilayer printed circuit board)

A multilayer copper-clad laminate having inner layer circuits was made in the same way as in Example 1 by using said 50 μm thick adhesive film and its surface roughness was measured by a feeler type surface roughness tester. At the location of measurement on the outer layer surface on a 25 mm straight line including the portion where inner layer circuit was present immediately therebelow and the portion devoid of such circuit, the 10-point average of level difference between said circuit-laid portion and no-circuit portion was less than 3 μm, indicating good surface flatness suited for circuit working of said laminate.

Using this multilayer copper-clad laminate having inner layer circuits, a 10-layer printed circuit board was made in the same way as in Example 1.

(Test of multilayer printed circuit board)

A part of this 10-layer printed circuit board was cut out and its thermal expansion coefficient and bending modulus were measured according to TMA and bending mode DMA, respectively. The mean thermal expansion coefficient of the longitudinal and transverse directions was 10 ppm/° C. (at normal temperature) and the mean bending modulus of the longitudinal and transverse directions was 60 GPa at normal temperature and 40 GPa at an elevated temperature (200° C.). Barcol hardness of this board was 65 at normal temperature and 50 at an elevated temperature (200° C.).

(Wire bonding workability)

Wire bonding was conducted with this 10-layer printed circuit board in the same way as in Example 1. It was possible perform wire bonding in a quite satisfactory way.

(Thermal shock test)

In the thermal shock test conducted on said 10-layer printed circuit board in the same way as in Example 1, no trouble such as disconnection occurred at solder joints even after 2,000 test cycles. There was also seen no trouble such as disconnection in the conduction test of the circuits including interstitial via holes in the board.

EXAMPLE 4

(Varnish)

In a resin varnish comprising 70 parts by weight of a salicylaldehyde novolak epoxy resin (molecular weight: 1,000; epoxy equivalent: 180), 30 parts by weight of a bisphenol A novolak resin (molecular weight: 700; hydroxyal equivalent: 118), 0.5 part by weight of N-methylimidazole as curing accelerator and 70 parts by weight of methyl ethyl ketone, the aluminum borate whiskers having an average diameter of 0.8 μm and an average fiber length of 20 μm were blended in an amount of 90 parts by weight per 100 parts by weight of resin solids, and the mixture was stirred until aluminum borate whiskers were uniformly dispersed in the varnish.

The dispersion was passed through a 200-mesh nylon filter to separate whisker aggregates of the sizes greater than 50 μm.

(Adhesive film)

The resulting insulating varnish cleared of said whisker aggregates greater than 50 μm was knife coated on the 18 μm thick copper foils and the 50 μm thick PET films and dried by heating at 150° C. for 10 minutes to half-cure the resins while removing the solvent to make the copper-foiled adhesive films having an adhesive layer thickness of 50 μm and 100 μm, and the PET film-attached adhesive films having an adhesive layer thickness of 50 μm and 100 μm. PET film was peeled off from the PET film-attached adhesive films to obtain the 50 μm and 100 μm thick adhesive films comprising whiskers and half-cured epoxy resins with a whisker volume fraction of 30%.

The copper-foiled adhesive films could be cut clean without causing scattering of resin by a cutting knife and shears, were blocking-free and had good handling qualities. Also, the adhesive films produced by coating said insulating varnish on PET films suffered no trouble such as break during peeling of PET film and normal handling, could be cut clean without causing scattering of resin, were blocking-free and had good handling qualities.

(Galvanic corrosion test)

Insulation resistance of the galvanic corrosion test pieces made by using said copper-foiled adhesive films having an adhesive layer thickness of 50 μm in the same way as in Example 1 was higher than $10^9$ Ω, which confirmed excellent galvanic corrosion resistance of said adhesive film.

(Bending modulus)

Bending modulus, measured by a three-point bending test, of the laminate obtained by using said 100 μm thick adhesive film in the same way as in Example 1 was 20 GPa (average of measurements in the longitudinal and transverse directions, without copper foil).

(Drilling accuracy)

Positional dicrepancy between the holes in the top and bottom laminates of a 0.3 mmφ-drilled 10-piece assembly of said copper-clad laminates made in the same way as in Example 1 was less than 20 μm.

(Multilayer printed circuit board)

A multilayer copper-clad laminate having inner layer circuits was made by following the procedure of Example 1 and its surface roughness was measured by a feeler type surface roughness tester. At the location of measurment on the outer layer surface on a 25 mm straight line including the portion where inner layer circuit was present immediately therebelow and the portion having no circuit therebelow, the 10-point average of level difference between said circuit-laid portion and no-circuit portion was less than 3 μm, which evidenced good surface flatness suited for circuit working of said laminate.

Using this multilayer copper-clad laminate having inner layer circuits, a 10-layer printed circuit board was made in the same way as in Example 1.

(Test of multilayer printed circuit board)

A part of this multilayer printed circuit board was cut out and its thermal expansion coefficient and bending modulus were measured according to TMA and bending mode DMA, respectively. The mean thermal expansion coefficient of the longitudinal and transverse directions was 10 ppm/° C. (at normal temperature) and the mean bending modulus of the longitudinal and transverse directions was 60 GPa at normal temperature and 50 GPa at an elevated temperature (200° C.). Barcol hardness of the board was 65 at normal temperature and 55 at an elevated temperature (200° C.).

(Wire bonding workability)

Wire bonding could be conducted in a satisfactory way with this circuit board in accordance with the method of Example 1.

(Thermal shock test)

In the thermal shock test conducted in the same way as in Example 1, no trouble such as disconnection took place at solder joints even after 2,000 test cycles. Also, no trouble was observed in the conduction test of the circuits including interstitial via holes in the board.

COMPARATIVE EXAMPLE 4

(Varnish)

In a resin varnish comprising 70 parts by weight of a bisphenol A novolak epoxy resin (molecular weight: 1,200; epoxy equivalent: 206), 30 parts by weight of a bisphenol Anovolak resin (molecular weight: 700; hydroxyl equivalent: 118), 0.5 part by weight of 2-ethyl-4-methylimidazole and 70 parts by weight of methyl ethyl ketone, the aluminum borate whiskers having an average diameter of 0.8 μm and an average fiber length of 20 μm were blended in an amount of 90 parts by weight per 100 parts by weight of resin solids, and the mixture was stirred until the whiskers were uniformly dispersed in the varnish.

(Adhesive film)

The thus obtained insulating varnish, without having been passed through a 200-mesh nylon filter, was knife coated on the 18 μm thick copper foils and 50 μm thick PET films and dried by heating at 150° C. for 10 minutes to half-cure the resins while removing the solvent to make the copper-foiled adhesive films having an adhesive layer thickness of 50 μm and 100 μm and the PET film-attached adhesive films having an adhesive layer thickness of 50 μm and 100 μm. PET film was peeled off from PET film-attached adhesive films to obtain the 50 μm and 100 μm thick adhesive films comprising whiskers and half-cured epoxy resins with a whisker volume fraction of 30%.

The copper-foiled adhesive films could be cut clean without causing scattering of resin by a cutting knife and shears, kept free from blocking with each other and had good handling qualities. Also, the adhesive films made by coating the insulating varnish on PET films had no trouble such as break during peeling of PET film and normal handling, could be cut clean withoug causing scattering of resin by a cutting knife and shears, kept free from blocking with each other and had good handling qualities.

(Galvanic corrosion test)

Following the procedure of Example 1, a galvanic corrosion test piece was made by using said adhesive film having an insulating layer thickness of 50 μm and its change with time was examined in an atmosphere of 85° C. and 85% RH. Insulation resistance of the test piece after left in said atmosphere for 250 hours was below $10^9$ Ω, indicating poor galvanic corrosion resistance of the adhesive film.

(Bending modulus)

Bending modulus, measured by a three-point bending test, of the copper-clad laminate obtained by using said 100 μm thick adhesive film in the same way as in Example 1 was 20 GPa (average of measurements in the longitudinal and transverse directions, without copper foil).

(Drilling accuracy)

Positional discrepancy between the holes in the top and bottom laminates of a 0.3 mmφ-drilled 10-piece assembly of said copper-clad laminates made in the same way as in Example 1 was less than 20 μm.

(Multilayer printed circuit board)

A multilayer copper-clad laminate having inner layer circuits was made in the same way as in Example 1 and its surface roughness was measured by a feeler type surface roughness tester. At the location of measurement on the outer layer surface of the laminate on a 25 mm straight line including the portion where inner layer circuit was present immediately therebelow and the portion where no such circuit was present, the 10-point average of level difference between said two portions was less than 3 μm, which implies good surface flatness suited for circuit scribing of the laminate.

(Test of multilayer printed circuit board)

A part of said multilayer printed circuit board was cut out and its thermal expansion coefficient and bending modulus were determined according to TMA and bending mode DMA, respectively. The mean thermal expansion coefficient of the longitudinal and transverse directions was 10 ppm/° C. (at normal temperature) and the mean bending modulus of the longitudinal and transverse directions was 60 GPa at normal temperature and 40 GPa at an elevated temperature (200° C.). Barcol hardness of the board was 65 at normal temperature and 50 at an elevated temperature (200° C.).

(Wire bonding workability)

Wire bonding could be conducted in a satisfactory way with said 10-layer printed circuit board in accordance with the method of Example 1.

(Thermal shock test)

In the thermal shock test conducted in the same way as in Example 1, there was observed no trouble such as disconnection at solder joints even after 2,000 test cycles. Also, no trouble occurred in the conduction test of the circuits including interstitial via holes in the board.

COMPARATIVE EXAMPLE 5

(Prepreg)

A resin varnish comprising 70 parts by weight of a bisphenol A novolak epoxy resin (molecular weight: 1,200; epoxy equivalent: 206), 30 parts by weight of a bisphenol A novolak resin (molecular weight: 700; hydroxyl equivalent: 118), 0.5 part by weight of 2-ethyl-4-methylimidazole and 70 parts by weight of methyl ethyl ketone was impregnated in the 50 μm thick and 100 μm thick pieces of glass cloth and dried by heating at 150° C. for 10 minutes to half-cure the resins while removing the solvent -to produce the 70 μm thick and 120 μm thick glass-reinforced epoxy prepregs composed of glass cloth and half-cured epoxy resins.

Scattering of resin took place when these prepregs were cut by a cutting knife and shears.
(Galvanic corrosion test)

Insulation resistance of the galvanic corrosion test pieces made by using said epoxy prepreg having an insulating layer thickness of 50 µm in the same way as in Example 1 was higher than $10^9$ Ω, which confirmed excellent galvanic corrosion resistance of the cured products of said epoxy prepreg.
(Bending modulus)

Bending modulus, measured by a three-point bending test, of the copper-clad laminate made by using the 120 µm thick glass-reinforced epoxy pregreg in the same way as in Example 1 was 8 GPa (average of measurements in the longitudinal and transverse directions, without copper foil).
(Drilling accuracy)

Positional discrepancy between the holes in the top and bottom laminates of a 0.3 mmφ-drilled 10-piece assembly of said copper-clad laminates made in the same way as in Example 1 was greater than 50 µm.
(Multilayer printed circuit board)

A multilayer copper-clad laminate having inner layercircuits was made in the same way as in Example 1 and its surface routhness was measured by a feeler type surface roughness tester. At the location of measurement on the outer layer surface of the laminate on a 25 mm straight line including the portion where inner layer circuit was present immediately therebelow and the portion devoid of such circuit, the 10-point average of level difference between said portions was greater than 8 µm.

A predetermined position of the surface copper foil of said multilayer copper-clad laminate was etched away to form a 75 µm-diameter opening, and it was tried to drill this opening by using impact laser mfd. by Sumitomo Heavy Industries, Ltd., but the glass portion could not be removed.

COMPARATIVE EXAMPLE 6

(Adhesive film)

A thermosetting resin comprising 50 parts by weight of a high-molecular weight epoxy polymer having a weight-average molecular weight of 50,000, 50 parts by weight of a bisphenol A epoxy resin (molecular weight: 1,200; epoxy equivalent: 206), 0.2 equivalent of a phenolic resin masked diisocyanate as crosslinking agent of said high-molecular weight epoxy polymer and 0.5 part by weight of 2-ethyl-4-methylimidazole as curing agent was knife coated on an 18 µm thick copper foil and a 50 µm thick PET film and dried by heating at 150° C. for 10 minutes to half-cure the resins while removing the solvent to make a copper-foiled adhesive film having an adhesive layer thickness of 50 µm and a PET film-attached adhesive film having an adhesive layer thickness of 50 µm. PET film was stripped off from the PET film-attached adhesive film to make a 50 µm thick adhesive film composed of half-cured epoxy resins.

The thus obtained adhesive film suffered no trouble such as break during peeling of PET film and normal handling and could be cut clean without causing scattering of resin, but blocking took place between prepregs, impairing handling qualities of the adhesive film.
(Galvanic corrosion test)

Insulation resistance of the test pieces measured in the same way as in Example 1 was higher than $10^9$ Ω, which confirmed high galvanic corrosion resistance of the present adhesive film.
(Multilayer printed circuit board)

Said 50 µm thick adhesive film was laid on both sides of the interlayer substrate made in Comparative Example 4, and an 18 µm thick single-side roughened copper foil was further laid on the outside of said adhesive film so that the roughened side of the copper foil would face the adhesive film, and the assembly was hot pressure molded to make a multilayer copper-clad laminate having inner layer circuits.

Surface roughness of this multilayer copper-clad laminate was measured by a feeler type surface roughness tester. At the location of measurement on the outer layer surface on a 25 mm straight line including the portion where inner layer circuit was present immediately thereblow and the portion where no such circuit was present, the 10-point average of level difference between these portions was less than 3 µm, indicating good surface flatness suited for circuit scribing of said laminate.

Using this multilayer copper-clad laminate having inner layer circuits, a 10-layer printed circuit board was manufactured following the procedure of Example 1.
(Test of multilayer printed circuit board)

A part of this multilayer printed circuit board was cut out and its thermal expansion coefficient and bending modulus were determined according to TMA and bending mode DMA, respectively. The mean thermal expansion coefficient of the longitudinal and transverse directions was 30 ppm/° C. (at normal temperature) and the mean bending modulus of the longitudinal and transverse directions was 20 GPa at normal temperature and 10 GPa at an elevated temperature (200° C.). Barcol hardness of the board was 30 at normal temperature and 10 at an elevated temperature (200° C.).
(Wire bonding workability)

Bare chips were mounted at a part of said 10-layer printed circuit board and connected to surface circuits by wire bonding. Wire bonding was conducted under the conditions of: ultrasonic output=1 W; ultrasonic output duration=50 µs; bonding load=100 g. Separation of wires occurred even when the wire bonding temperature was lowered to 100° C.
(Thermal shock test)

In the thermal shock test same as practiced in Example 1, disconnection occurred at solder joints after around 100 test cycles. Disconnection was also observed in the conduction test of the circuits including interstitial via holes in the board.

As described above, in the insulating varnish producing process according to the second embodiment of the present invention, it is possible to prevent the electrical insulating whiskers from existing in the form of aggregates in the whisker-blended adhesive film at the stage of insulating varnish, so that insulation reliability of the adhesive film is enhanced. The adhesive film obtained by using the insulating varnish produced according to the second embodiment of the present invention is thus characterized by the addition of electrical insulating whiskers which made it possible to shape the epoxy resin prepregs into a sheet, and the printed circuit boards made by using this adhesive film have good circuit workability because of flat surface, high packaging reliability because of high rigidity, good wire bonding workability because of high surface hardness, and high dimensional stability because of small thermal expansion coefficient. This embodiment of the present invention, therefore, greatly contributes to the realization of higher packaging density, smaller size, higher reliability and lower cost of the multilayer printed circuit boards.

EXAMPLE 5

(Varnish)

A thermosetting resin comprising 70 parts by weight of a bisphenol A novolak epoxy resin (molecular weight: 1,200; epoxy equivalent: 206), 30 parts by weight of a bisphenol A novolak resin (molecular weight: 700; hydroxyl equivalent: 118) and 0.5 part by weight of 2-ethyl-4-methylimidazole was supplied into a slurry of aluminum borate whiskers and stirred until the whiskers were uniformly dispersed in the varnish.

The slurry of aluminum borate whiskers was obtained by supplying 90 parts by weight of aluminum borate whiskers having an average diameter of 0.8 µm and an average fiber length of 20 µm into 180 parts by weight of methyl ethyl ketone and mixing them with stirring for 15 minutes.

The thus obtained insulating varnish was knife coated on the 18 µm thick copper foils and the 50 µm thick PET films and dried by heating at 150° C. for 10 minutes to half-cure the resins while removing the solvent to make the copper-foiled adhesive films having an adhesive layer thickness of 50 µm and 100 µm and the PET film-attached adhesive films having an adhesive layer thickness of 50 µm and 100 µm. Then PET film was stripped off from the PET film-attached adhesive films to obtain the 50 µm and 100 µm thick adhesive films composed of whiskers and half-cured epoxy resins with a whisker volume fraction of 30%.

The copper-foiled adhesive films could be cut clean without causing scattering of resin by a cutting knife and shears, showed no blocking tendency to each other and had good handling qualities. Also, the adhesive films made by coating the varnish on PET films suffered no trouble such as break during peeling of PET film and normal handling, could be cut clear without causing scattering of resin by a cutting knife and shears, kept free from blocking and had good handling qualities.

(Galvanic corrosion test)

On the copper foil surface of a 0.8 mm thick double-sided copper-clad glass-reinforced epoxy laminate, an etching resist pattern was formed in conformity to the inner layer electrode to be used in the galvanic corrosion test, and after removing the unnecessary portion of the copper foil by etching, said copper-foiled adhesive film having an insulating layer thickness of 50 µm was laminated on both sides of said laminate so that the adhesive film would contact the electrode pattern, and the laminate was hot-pressure molded under the conditions of 175° C., 2.5 MPa and 60 minutes. At the part of the molded laminate which was positioned in registration with the inner layer electrode pattern, an etching resist pattern was formed in conformity to the shape of the outer layer electrode, and the unnecessary portion of the copper foil was etched away to obtain a galvanic corrosion test piece.

50 V was applied across the formed inner and outer layer electrodes, and insulation resistance of the laminate was measured after having been left in an atmosphere of 85° C. and 85% RH for 1,000 hours. The laminate showed insulation resistance of higher than $10^9$ Ω, indicating excellent galvanic corrosion resistance of the adhesive film.

(Bending modulus)

An 18 µm thick single-side roughened copper foil was placed on both sides of the 100 µm thick adhesive film so that the roughened side of the foil would face the adhesive film, and hot-pressure molded under the conditions of 175° C., 2.5 MPa and 60 minutes.

The copper foil of the resulting copper-clad laminate was etched away and the bending modulus of the laminate was measured by a three-point bending test. It was 20 GPa (average of measurements in the longitudinal and transverse directions, without copper foil).

(Drilling accuracy)

A 10-piece assembly of said copper-clad lamiantes was drilled by a 0.3 mm-bore drill and the positional discrepancy between the holes in the top and bottom laminates was measured. It was less than 20 µm.

(Multilayer printed circuit board)

The unnecessary part of the copper foil of said copper-clad laminate was etched away to form a circuit, and the previously made 50 µm thick adhesive film of the present invention was placed on both sides of the laminate. On the outside thereof was further laminated an 18 µm thick single-sided roughened copper foil so that its roughened side would face the adhesive film, followed by hot pressure molding under the conditions of 175° C., 2.5 MPa and 60 minutes to make a multilayer copper-clad laminate having inner layer circuits.

The surface roughness of this multilayer copper-clad laminate was measured by a feeler type surface roughness tester. At the location of measurement on the outer layer surface on a 25 mm straight line including the portion where the inner layer circuit was present immediately therebelow and the portion where no such circuit was present, the 10-point average of level difference between said portions was less than 3 µm, indicating excellent surface flatness suited for circuit working of the laminate.

Further, the predetermined position of the surface copper foil of said multilayer copper-clad laminate having inner layer circuits was etched away to form an opening with a diameter of 75 µm, and this opening was drilled by an impact laser mfd. by Sumitomo Heavy Industries, Ltd., followed by a smearing treatment with permanganic acid, electroless plating, printing of an etching pattern, development thereof and removal of the unnecessary copper by etching to form a circuit.

On both sides of the thus obtained multilayer printed circuit board was placed said 50 µm adhesive film, and on the outside thereof was further placed an 18 µm thick single-sided roughened copper foil so that its roughened side would face the adhesive film, and the assembly was hot pressure molded under the conditions of 175° C., 2.5 MPa and 60 minutes to make a multilayer copper-clad laminate having inner layer circuits. Then the copper foil at the predetermined position of the laminate was etched away to form an opening with a diameter of 75 µm and this opening was drilled by an impact laser mfd. by Sumitomo Heavy Industries, Ltd., followed by smearing with permanganic acid, electroless plating, printing and development of the etching pattern, and removal of the unnecessary copper by etching to form a circuit. The above operations were repeated to make a 10-layer printed circuit board.

(Test of multilayer printed circuit board)

A part of this multilayer printed circuit board was cut out and its thermal expansion coefficient and bending modulus were measured according to TMA and bending mode DMA, respectively. The mean thermal expansion coefficient of the longitudinal and transverse directions was 10 ppm/° C. (at normal temperature) and the mean bending modulus of the longitudinal and transverse directions was 60 GPa at normal temperature and 40 GPa at an elevated temperature (200° C.). The Barcol surface hardness was 65 at normal temperature and 50 at an elevated temperature (200° C.).

(Wire bonding workability)

Wire bonding could be conducted in a satisfactory manner with this circuit board according to the method of Example 1.

(Thermal shock test)

In the thermal shock test conducted in the same way as in Example 1, no trouble such as disconnection occurred at the solder joints even after 2,000 test cycles.

Also, no trouble such as disconnection was observed in the conduction test of the circuits including interstitial via holes in the board.

EXAMPLE 6

(Varnish)

A thermosetting resin comprising 70 parts by weight of a salicylaldehyde novolak epoxy resin (molecular weight: 1,000; epoxy equivalent: 180), 30 parts by weight of a bisphenol A novolak resin (molecular weight: 700; hydroxyl equivalent: 118) and 0.5 part by weight of N-methylimidazole was fed into a slurry of aluminum borate whiskers and stirred until the whiskers were uniformly dispersed in the varnish.

Said slurry of aluminum borate whiskers was obtained by feeding 90 parts by weight of aluminum borate whiskers having an average diameter of 0.8 µm and an average fiber length of 20 µm into 180 parts by weight of methyl ethyl ketone and mixing them by stirring for 15 minutes.

(Adhesive film)

The thus obtained insulating varnish was knife coated on an 18 µm thick copper foil and a 50 µm thick PET film and dried by heating at 150° C. for 10 minutes to half cure the resins while removing the solvent to obtain the copper-foiled adhesive films having an adhesive layer thickness of 50 µm and 100 µm and the PET film-attached adhesive films having an adhesive layer thickness of 50 µm and 100 µm. PET film was peeled off from the PET-attached adhesive films to make the 50 µm thick and 100 µm thick adhesive films comprising whiskers and half-cured epoxy resin with a whisker volume fraction of 30%.

The produced copper-foiled adhesive films could be cut clean without causing scattering of resin by a cutting knife and shears, and they were proof against blocking and had good handling qualities. Also, the adhesive films made by coating the PET films with said insulating varnish suffered no trouble such as break during peeling of the PET film and normal handling, could be cut clean without scattering of resin by a cutting knife and shears, remained free from blocking and had good handling qualities.

(Galvanic corrosion test)

Insulation resistance of the test pieces made and tested in the same way as in Example 5 was higher than $10^9$ Ω, indicating excellent galvanic corrosion resistance of said adhesive films.

(Bending modulus)

Bending modulus of the laminates made by using said adhesive films in the same way as in Example 5, as measured by a three-point bending test, was 20 GPa (average of measurements in the longitudinal and transverse directions, without copper foil).

(Drilling accuracy)

Positional discrepancy between the holes in the top and bottom laminates of a 0.3 mmφ-drilled 10-piece accumulation of said copper-clad laminates was less than 20 µm.

(Multilayer printed circuit board)

Surface roughness of a multilayer copper-clad laminate having inner layer circuits made in the same way as in Example 5 was measured by a feeler type surface roughness tester. As a result, at the location of measurement on the outer layer surface on a 25 mm long straight line including the portion where inner layer circuit was present immediately therebelow and the portion where no such circuit was present, the 10-point average of level difference between said portions was less than 3 µm, indicating excellent surface flatness suited for circuit working of said laminate.

Using these multilayer copper-clad laminates having inner layer circuits, a 10-layer printed circuit board was manufactured in the same way as in Example 5.

(Test of multilayer printed circuit board)

Thermal expansion coefficient and bending modulus of said multilayer printed circuit board were determined in the same way as described above. As a result, the mean thermal expansion coefficient of the longitudinal and transverse directions was 10 ppm/° C. (at normal temperature) and the mean bending modulus of the longitudinal and transverse directions was 60 GPa at normal temperature and 50 GPa at an elevated temperature (200° C.). Barcol surface hardness of the laminate was 65 at normal temperature and 55 at an elevated temperature (200° C.).

(Wire bonding workability)

Wire bonding could be performed in a satisfactory way with this board in accordance with the method of Example 1.

(Thermal shock test)

In the thermal shock test conducted in the same way as in Example 1, there occurred no trouble such as disconnection at the solder joints even after 2,000 test cycles. Also, not rouble such as disconnection was noted in the conduction test of the circuits including interstitial via holes in the board.

COMPARATIVE EXAMPLE 7

(Varnish)

In a thermosetting resin comprising 70 parts by weight of a bisphenol A novolak epoxy resin (molecular weight: 1,200; epoxy equivalent: 206), 30 parts by weight of a bisphenol A novolak resin (molecular weight: 700; hydroxyl equivalent: 118), 0.5 part by weight of 2-ethyl-4-methylimidazole and 70 parts by weight of ethyl ethyl ketone, the aluminum borate whiskers having an average diameter of 0.8 µm and an average fiber length of 20 µm were blended in an amount of 90 parts by weight per 100 parts by weight of resin solids and stirred until the aluminum borate whiskers were uniformly dispersed in the varnish.

(Adhesive film)

This insulating varnish was knife coated on an 18 µm thick copper foil and a 50 µm thick PET film and dried by heating at 150° C. for 10 minutes to half cure the resins while removing the solvent to obtain the copper-foild adhesive films having an adhesive layer thickness of 50 µm and 100 µm and the PET film-attached adhesive films having an adhesive layer thickness of 50 µm and 100 µm. PET film was peeled off from the PET-attached adhesive films to make the 50 µm thick and 100 µm thick adhesive films comprising whiskers and half-cured epoxy resin with a whisker volume fraction of 30%.

The thus obtained copper-foiled adhesive films could be cut clean without causing scattering of resin, remained free from blocking and had good handling qualities. Also, the PET-attached adhesive films had no trouble such as break during peeling of the PET film and normal handling, could be cut clean without causing scattering of resin, remained free from blocking and had good handling qualities.

(Galvanic corrosion test)

A galvanic corrosion test piece was made using said adhesive film with an insulating layer thickness of 50 µm and its change with time was examined under an atmosphere of 85° C. and 85% RH, in the same way as in Example 5. Insulation resistance of the test piece after having been left in said atmosphere for 250 hours was less than $10^9$ Ω manifesting poor galvanic corrosion resistance of said adhesive film.

(Bending modulus)

Bending modulus of a copper-clad laminate made by using said 100 µm thick adhesive film in the same way as in Example 5, as measured by a three-point bending test, was 20 GPa (average of measurements in the longitudinal and transverse directions, without copper foil).

(Drilling accuracy)

Positional discrepancy between the holes in the top and bottom laminates in a 0.3 mmφ-drilled 10-piece assembly of said copper-clad laminates was less than 20 μm.

(Multilayer printed circuit board)

A multilayer copper-clad laminate having inner layer circuits was made by using said 50 μm thick adhesive film in the same way as in Example 5 and its surface roughness was measured by a feeler type surface roughness tester. At the location of measurement on the outer layer surface on a 25 mm straight line including the portion where inner layer circuit was present immediately therebelow and the portion where no circuit was present, the 10-point average of level difference between said portions was less than 3 μm, indicating excellent surface flatness suited for circuit working of said laminate. Using this multilayer copper-clad laminate having inner layer circuits, a 10-layer printed circuit board was made in the same way as in Example 5.

(Test of multilayer printed circuit board)

Thermal expansion coefficient and bending modulus of said multilayer printed circuit board were determined in the same way as described above. As a result, the mean thermal expansion coefficient of the longitudinal and transverse directions was 10 ppm/° C. (at normal temperature) and the mean bending modulus of the longitudinal and transvese directions was 60 GPa at normal temperature and 40 GPa at an elevated temperature (200° C.). Barcol surface hardness of the laminate was 65 at normal temperature and 50 at an elevated temperature (200° C.).

(Wire bonding workability)

Wire bonding could be performed in a satisfactory way in accordance with the method of Example 1.

(Thermal shock test)

In the thermal shock test of said 10-layer printed circuit board conducted in the same way as in Example 1, there took place no trouble such as disconnection at the solder joints even after 2,000 test cycles.

Also, no trouble such as disconnection was observed in the conduction test of the circuits including interstitial via holes in the board.

COMPARATIVE EXAMPLE 8

(Prepreg)

A thermosetting resin comprising 70 parts by weight of a bisphenol A novolak epoxy resin (molecular weight: 1,200; epoxy equivalent: 206), 30 parts by weight of a bisphenol A novolak resin (molecular weight: 700; hydroxyl equivalent: 118), 0.5 part by weight of 2-ethyl-4-methylimidazole and 70 parts by weight of methyl ethyl ketone was impregnated in the 50 μm and 100 μm thick pieces of glass cloth and dried by heating at 150° C. for 10 minutes to half cure the resins while removing the solvent to make the 70 μm and 120 μm thick epoxy prepregs composed of glass cloth and half-cured epoxy resin.

The produced prepregs, when cut by a cutting knife and shears, caused scattering of resin.

(Galvanic corrosion test)

On the copper foil of a 0.8 mm thick double-sided copper-clad glass-reinforced epoxy laminate, an etching resist pattern was formed so as to provide an inner layer electrode for the galvanic corrosion test, and the unnecessary portion of the copper foil was etched away. Then the previously made epoxy prepreg having an insulating layer thickness of 70 μm and an 18 μm thick single-side roughened copper foil were laminated on both sides of said pattern-formed copper-clad laminate in such a manner that the epoxy prepreg would face the electrode-forming pattern on the inner layer surface and hot-pressure molded under the conditions of 175° C., 2.5 Mpa and 60 minutes. The unnecessary portion of the copper foil of the obtained laminate was etched away, and a pattern designed to provide an outer layer electrode was formed at the part positioned in registration with the inner layer electrode pattern. 50 V was applied across said inner and outer layer electrodes, and insulation resistance of the test pieces after having been left in an atmosphere of 85° C. and 85% RH for 1,000 hours was measured. It was above $10^9$ Ω, which confirmed excellent galvanic corrosion resistance of said adhesive film.

(Bending modulus)

An 18 μm thick single-sided roughened copper foil was laminated on both sides of the produced 120 μm thick epoxy prepreg so that the roughened side of the copper foil would face the prepreg, and the assembly was hot pressure molded under the conditions of 175° C., 2.5 MPa and 60 minutes. The copper foil of the obtained copper-clad laminate was etched away and the bending modulus of the laminate was measured by a three-point bending test. It was 8 GPa (average of measurements in the longitudinal and transverse directions, without copper foil).

(Drilling accuracy)

A 10-piece assembly of said copper-clad laminates was drilled by a 0.3 mmφ drill and the positional discrepancy between the holes in the top and bottom laminates was measured. It was greater than 50 μm.

(Multilayer printed circuit board)

Circuits were formed on said copper-clad laminate to make an interlayer substrate, and a 70 μm thick glass-reinforced epoxy prepreg was laminated on both sides thereof. On the outside of said prepreg was further laminated an 18 μm thick single-sided roughened copper foil so that the roughened side of the copper foil would face the prepreg, and the assembly was hot pressure molded to make a multilayer copper-clad laminate having inner layer circuits.

The surface roughness of this multilayer copper-clad laminate was measured by a feeler type surface roughness tester. As a result, at the location of measurement on the outer layer surface on a 25 mm long straight line including the portion having inner layer circuit immediately therebelow and the portion having no such circuit therebelow, the 10-point average of level difference between said portions was greater than 8 μm.

Further, a predetermined position of the surface copper foil of said multilayer copper-clad laminate was etched away to form a 75 μm-diameter opening, and it was tried to drill this opening by an impact laser mfd. by Sumitomo Heavy Industries, Ltd., but it was impossible to remove the glass portion.

COMPARATIVE EXAMPLE 9

(Adhesive film)

A thermosetting resin comprising 50 parts by weight of a high-molecular weight epoxy polymer having a weight-average molecular weight of 50,000, N,N-dimethylacetamide used as diluent in such an amount that the high-molecular weight epoxy polymer would become 30% by weight as solids, 50 parts by weight of a bisphenol A epoxy resin (molecular weight: 343; epoxy equivalent: 175), 0.2 equivalent of a phenol resin masked diisocyanate as crosslinking agent of the high-molecular weight epoxy polymer, and 0.5 part by weight of 2-ethyl-4-methylimidazole was knife coated on an 18 μm thick copper foil and a 50 μm thick PET film and dried by heating at 150° C. for 10 minutes to half cure the resins while removing the solvent to obtain a copper-foiled adhesive film having an adhesive layer thickness of 50 μm and a PET film-attached adhesive film having an adhesive layer thickness of 50 μm. PET film was peeled off from the PET film-attached adhesive film to make a 50 μm thick adhesive film composed of whiskers and harf-cured epoxy resins with a whisker volume fraction of 30%.

The thus obtained adhesive film encountered no trouble such as break during peeling of the PET film and normal handling and could be cut clean without causing scattering of resin, but this film was liable to blocking and bad in handling qualities.

(Galvanic corrosion test)

Insulation resistance of the test pieces measured in the same way as in Example 5 was greater than $10^9$ Ω, which confirmed excellent galvanic corrosion resistance of said adhesive film.

(Multilayer printed circuit board)

Said 50 μm thick adhesive film was placed on both sides of the interlayer substrate manufactured in Comparative Example 7, and on the outside of said adhesive film was further laminated an 18 μm thick single-sided roughened copper foil so that the roughened side of the copper foil would face the adhesive film, and the assembly was hot pressure molded under the conditions of 175° C., 2.5 MPa and 60 minutes to make a multilayer copper-clad laminate having inner layer circuits.

The surface roughness of this multilayer copper-clad laminate was measured by a feeler type surface roughness tester. As a result, at the location of measurement on the outer layer surface on a 25 mm long straight line including the portion having inner layer circuit immediately therebelow and the portion having no such circuit, the 10-point average of level difference between said portions was less than 3 μm, indicating excellent surface flatness suited for circuit working of said laminate.

Using said multilayer copper-clad laminate having inner layer circuits, a 10-layer printed circuit board was made in the same way as in Example 5.

(Test of multilayer printed circuit board)

A part of this multilayer printed circuit board was cut out and its thermal expansion coefficient and bending modulus were measured according to TMA and bending mode DMA, respectively. The mean thermal expansion coefficient of the longitudinal and transverse directions was 30 ppm/° C. (at normal temperature) and the mean bending modulus of the longitudinal and transverse directions was 20 GPa at normal temperature and 10 GPa at an elevated temperature (200° C.). Barcol surface hardness of the board was 30 at normal temperature and 10 at an elevated temperature (200° C.).

(Wire bonding workability)

Bare chips were mounted at a part of this 10-layer printed circuit board and connected to the surface circuits by wire bonding conducted under the conditions of: ultrasonic output=1 W; ultrasonic output duration=50 μs; bonding load=100 g. The wires separated even when the wire bonding temperature was lowered to 100° C.

(Thermal shock test)

In the thermal shock test conducted in the same way as in Example 1, disconnection occurred at the solder joints after about 100 test cycles. Disconnection was also seen in the conduction test of the circuits including interstitial via holes in the board.

As described above, according to the insulating varnish producing method in the third embodiment of the present invention, it is possible to prevent the electrical insulating whiskers from existing in the form of aggregates in the whisker-incorporated adhesive film, thus elevating insulation reliability of the adhesive film. The adhesive film obtained by using the insulating varnish produced according to the third embodiment of the present invention is indebted for its realization to the addition of electrical insulating whiskers which made it possible to shape the epoxy resin prepregs into a sheet, and the printed circuit boards made by using such adhesive films have good circuit workability because of their flat surface, high packaging reliability because of high rigidity, excellent wire bonding workability because of high surface hardness, and improved dimensional stability because of small thermal expansion coefficient. This embodiment of the present invention, therefore, greatly contributes to the realization of higher packaging density, smaller size, higher reliability and lower cost of the multilayer printed circuit boards.

EXAMPLE 7

(Varnish)

In a thermosetting resin comprising 70 parts by weight of a bisphenol A novolak epoxy resin (molecular weight: 1,200; epoxy equivalent: 208), 30 parts by weight of a bisphenol A novolak resin (molecular weight: 700; hydroxyl equivalent: 118), 0.5 part by weight of 2-ethyl-4-methylimidazole as curing accelerator and 70 parts by weight of methyl ethyl ketone, the aluminum borate whiskers having an average diameter of 0.8 μm and an average fiber length of 20 μm were blended in an amount of 90 parts by weight per 100 parts by weight of the resin solids and stirred until a slurry of said whiskers was formed.

This slurry was mixed and milled by a batch type zirconia-made beads mill for 90 minutes and then passed through a 200-mesh nylon filter to separate the beads, and the milled varnish was deaerated by a vacuum dryer to obtain an insulating varnish.

(Adhesive film)

This insulating varnish was knife coated on the 18 μm thick copper foils and the 50 μm thick PET films and dried by heating at 150° C. for 10 minutes to half cure the resins while removing the solvent to obtain the copper-foiled adhesive films having an adhesive layer thickness of 50 μm and 100 μm and the PET film-attached adhesive films having an adhesive layer thickness of 50 μm and 100 μm. PET film was peeled off from the PET film-attached adhesive films to obtain the 50 μm thick and 100 μm thick adhesive films comprising whiskers and half-cured epoxy resin with a whisker volume fraction of 30%.

The thus produced copper-foiled adhesive films could be cut clean without causing scattering of resin by a cutting knife and shears, showed no liability to blocking and had good handling qualities. Also, the adhesive films made by coating the PET films with said insulating varnish suffered no trouble such as break during peeling of the PET film and normal handling, could be cut clean without causing scattering of resin by a cutting knife and shears, remained free from blocking and had good handling qualities.

(Galvanic corrosion test)

Insulation resistance of the test pieces measured in the same way as in Example 5 was over $10^9$ Ω, which confirmed excellent galvanic corrosion resistance of said adhesive films.

(Bending modulus)

Bending modulus of the copper-clad laminate made by using said 100 μm thick adhesive film in the same way as in Example 5, as measured by a three-point bending test, was 20 GPa (average of measurements in the longitudinal and transverse directions, without copper foil).

(Drilling accuracy)

Positional discrepancy between the holes in the top and bottom laminates of a 0.3 mmφ-drilled 10-piece assembly of said copper-clad laminates was less than 20 μm.

(Multilayer printed circuit board)

A multilayer copper-clad laminate having inner layer circuits was made by using said 50 μm adhesive film in the same way as in Example 5, and its surface roughness was measured by a feeler type surface roughness tester. As a result, at the location of measurement on the outer layer surface on a 25 mm long straight line including the portion having the inner layer circuit immediately therebelow and the portion having no such circuit, the 10-point average of level difference between said portions was less than 3 μm, indicating excellent surface flatness suited for circuit working of the laminate.

Using this multilayer copper-clad laminate having inner layer circuits, a 10-layer printed circuit board was manufactured in the same way as in Example 5.

(Test of multilayer printed circuit board)

A part of this multilayer printed circuit board was cut out and its thermal expansion coefficient and bending modulus were measured according to TMA and bending mode DMA, respectively. The mean thermal expansion coefficient of the longitudinal and transverse directions was 10 ppm/° C. (at normal temperature) and the mean bending modulus of the longitudinal and transverse directions was 60 GPa at normal temperature and 40 GPa at an elevated temperature (200° C.). Barcol surface hardness of the board was 65 at normal temperature and 50 at an elevated temperature (200° C.).

Using this multilayer copper-clad laminate having inner layer circuits, a 10-layer printed circuit board was manufactured in the same way as in Example 5.

(Test of multilayer printed circuit board)

A part of this multilayer printed circuit board was cut out and its thermal expansion coefficient and bending modulus were measured according to TMA and bending mode DMA, respectively. The mean thermal expansion coefficient of the longitudinal and transverse directions was 10 ppm/° C. (at normal temperature) and the mean bending modulus of the longitudinal and transverse directions was 60 GPa at normal temperature was 40 GPa at an elevated temperature (200° C.). Barcol surface hardness of the board was 65 at normal temperature and 50 at an elevated temperature (200° C.).

(Wire bonding workability)

Wire bonding could be conducted in a satisfactory way with said 10-layer printed circuit board in accordance with the method of Example 1.

(Thermal shock test)

In the thermal shock test conducted on said 10-layer printed circuit board in the same way as in Example 1, no trouble such as disconnection occurred at the solder joint seven after 2,000 test cycles.

Also, there was observed no trouble such as disconnection in the conduction test of the circuits including interstitial via holes in the board.

EXAMPLE 8

(Varnish)

In a thermosetting resin comprising 70 parts by weight of a salicylaldehyde novolak epoxy resin (molecular weight: 1,000; epoxy equivalent: 180), 30 parts by weight of a bisphenol A novolak resin (molecular weight: 700; hydroxylequivalent: 118), 0.5 part by weight of N-methylimidazole ascuring accelerator and 70 parts by weight of methyl ethyl ketone, the aluminum borate whiskers having an average diameter of 0.8 μm and an average fiber length of 20 μm were blended in an amount of 90 parts by weight per 100 parts by weight of the resin solids and stirred until a slurry of said whiskers was formed.

This slurry was mixed and milled by a batch type zirconia-made beads mill for 90 minutes and then passed through a 200-mesh nylon filter to separate the beads, and the milled varnish was deaerated by a vacuum dryer to obtain an insulating varnish.

(Adhesive film)

This insulating varnish was knife coated on the 18 μm thick copper foils and the 50 μm thick PET films and dried by heating at 150° C. for 10 minutes to half cure the resins while removing the solvent to make the copper-foiled adhesive films having an adhesive layer thickness of 50 μm and 100 μm and the PET film-attached adhesive films having an adhesive layer thickness of 50 μm and 100 μm. PET film was peeled off from the PET-attached adhesive films to obtain the 50 μm and 100 μm thick adhesive films comprising whiskers and half cured epoxy resin with a whisker volume fraction of 30%.

The produced copper-foiled adhesive films could be cut clean without causing scattering of resin by a cutting knife and shears, were free from blocking and had good handling qualities. Also, the adhesive films made by coating the PET films with said insulating varnish suffered no trouble such as break during peeling of the PET film and normal handling, could be cut clean without causing scattering of resin by a cutting knife and shears, were free from blocking and had good handling qualities.

(Galvanic corrosion test)

Insulation resistance of the test pieces made and examined in the same way as in Example 5 was higher than $10^9$ Ω, which confirmed excellent galvanic corrosion resistance of said adhesive film.

(Bending modulus)

Bending modulus measured by a three-point bending test of the copper-clad laminate made by using said 100 μm thick adhesive film was 20 GPa (average of measurements in the longitudinal and transverse directions, without copper foil).

(Drilling accuracy)

Positional discrepancy between the holes in the top and bottom laminates of a 0.3 mmφ-drilled 10-piece assembly of said copper-clad laminates was less than 20 μm.

(Multilayer printed circuit board)

A multilayer copper-clad laminate having inner layer circuits was made by using said 50 μm thick adhesive film in the same way as in Example 5 and its surface roughness was measured by a feeler type surface roughness tester. As a result, at the location of measurement on the outer layer surface on a 25 mm long straight line including the portion having the inner layer circuit immediately therebelow and the portion having no such circuit, the 10-point average of level difference between said portions was less than 3 μm, which endorsed excellent surface flatness suited for circuit working of said laminate.

Using this multilayer copper-clad laminate having inner layer circuits, a 10-layer printed circuit board was made in the same way as in Example 5.

(Test of multilayer printed circuit board)

A part of said multilayer printed circuit board was cut out and its thermal expansion coefficient and bending modulus were measured according to TMA and bending mode DMA, respectively. The mean thermal expansion coefficient of the longitudinal and transverse directions was 10 ppm/° C. (at normal temperature) and the mean bending modulus of the longitudinal and transverse directions was 60 GPa at normal temperature and 50 GPa at an elevated temperature (200° C.). Barcol surface hardness of the board was 65 at normal temperature and 55 atan elevated temperature (200° C.).

(Wire bonding workability)

Wire bonding could be performed in a satisfactory way with said 10-layer printed circuit board according to the method of Example 1.

(Thermal shock test)

In the thermal shock test conducted on said 10-layer printed circuit board in the same way as in Example 1, no trouble such as disconnection occurred at the solder joint seven after 2,000 test cycles. Also, there took place no trouble such as disconnection in the conduction test of the circuits including interestitial via holes in the board.

COMPARATIVE EXAMPLE 10

(Varnish)

In a resin varnish comprising 70 parts by weight of a bisphenol A novolak epoxy resin (molecular weight: 1,200; epoxy equivalent: 206), 30 parts by weight of a bisphenol A novolak resin (molecular weight: 700; hydroxyl equivalent: 118), 0.5 part by weight of 2-ethyl-4-methylimidazole and 70 parts by weight of methyl ethyl ketone, the aluminum borate whiskers having an average diameter of 0.8 μm and an average fiber length of 20 μm were blended in an amount of 90 parts by weight per 100 parts by weight of resin solids and stirred until the whiskers were uniformly dispersed in the varnish.

(Adhesive film)

This insulating varnish was knife coated on the 18 μm thick copper foils and the 50 μm thick PET films and dried by heating at 150° C. for 10 minutes to half-cure the resins while removing the solvent to make the copper-foiled adhesive films having an adhesive layer thickness of 50 μm and 100 μm and the PET film-attached adhesive films having an adhesive layer thickness of 50 μm and 100 μm. PET film was peeled off from the PET film-attached adhesive films to obtain the 50 μm and 100 μm thick adhesive films comprising whiskers and half-cured epoxy resin with a whisker volume fraction of 30%.

The obtained copper-foiled adhesive films could be cut clean without causing scattering of resin by a cutting knife and shears, showed no liability to blocking and had good handling qualities.

Also, the adhesive films obtained by coating the PET films with said insulating varnish suffered no trouble such as break during peeling of the PET film and normal handling, could be cut clean without causing scattering of resin by a cutting knife and shears, showed no liability to blocking and had good handling qualities.

(Galvanic corrosion test)

The galvanic corrosion test pieces were made using said adhesive film having an adhesive layer thickness of 50 μm and their change in insulation resistance with time when left in an atmosphere of 85° C. and 85% RH was observed, in the same way as in Example 5. Insulation resistance after 250 hours was less than $10^9$ Ω. indicating poor galvanic corrosion resistance of the adhesive film.

(Bending modulus)

The three-point bending modulus (bending modulus measured by the three-point bending test) of the copper-clad laminate obtained by using said 100 μm thick adhesive film in the same way as in Example 5 was 20 GPa (average of measurements in the longitudinal and transverse directions).

(Drilling accuracy)

Positional discrepancy between the holes in the top and bottom laminates of a 0.3 mmφ-drilled 10-piece assembly of said copper-clad laminates was less than 20 μm.

(Multilayer printed circuit board)

Surface roughness of a multilayer copper-clad laminate having inner layer circuits made in the same way as in Example 5 was measured by a feeler type surface roughness tester. At the location of measurement on the outer layer surface on a 25 mm long straight line including the portion having the inner layer circuit immediately therebelow and the portion having no such circuit, the 10-point average of level difference between said portions was less than 3 μm, pointing to excellent surface flatness suited for circuit working of said laminate.

Using this copper-clad laminate having inner layer circuits, a 10-layer printed circuit board was made in the same way as in Example 5.

(Test of multilayer printed circuit board)

A part of said multilayer printed circuit board was cut out and its thermal expansion coefficient and bending modulus were measured according to TMA and bending mode DMA, respectively. The mean thermal expansion coefficient of the longitudinal and transverse directions was 10 ppm/° C. (at normal temperature) and the mean bending modulus of the longitudinal and transverse directions was 60 GPa at normal temperature and 40 GPa at an elevated temperature (200° C.). Barcol surface hardness of the board was 65 at normal temperature and 50 at an elevated temperature (200° C.).

(Wire bonding workability)

Wire bonding could be conducted in a satisfactory way with said 10-layer printed circuit board according to the method of Example 1.

(Thermal shock test)

In the thermal shock test conducted on said 10-layer printed circuit board in the same way as in Example 1, no trouble such as disconnection occurred even after 2,000 testcycles. Also, there was observed no trouble such as disconnection in the conduction test of the circuits including interstitial via holes in the board.

COMPARATIVE EXAMPLE 11

(Prepreg)

A resin varnish comprising 70 parts by weight of a bisphenol A novolak epoxy resin (molecular weight: 1,200; epoxy equivalent: 206), 30 parts by weight of a bisphenol A novolak resin (molecular weight: 700; hydroxyl equivalent: 118), 0.5 part by weight of 2-ethyl-4-methylimidazole and 70 parts by weight of methyl ethyl ketone was impregnated in the 50 μm and 100 μm thick pieces of glass cloth and dried by heating at 150° C. for 10 minutes to half cure the resins while removing the solvent to make the 70 μm and 120 μm thick epoxy prepregs comprising glass cloth and half-cured epoxy resin.

These prepregs, when cut by a cutting knife and shears, caused scattering of resin.

(Galvanic corrosion test)

Insulation resistance of the test pieces measured in the same way as in Comparative Example 8 was higher than $10^9$ Ω, assuring excellent galvanic corrosion resistance of the cured products of said epoxy prepregs.

(Bending modulus)

The three-point bending modulus of the copper-clad laminate made by using said 120 μm thick epoxy prepreg was 8 GPa (average of measurements in the longitudinal and transverse directions, without copper foil).

(Drilling accuracy)

Positional discrepancy between the holes in the top and bottom laminates of a 0.3 mmφ-drilled 10-piece assembly of said copper-clad laminates was greater than 50 μm.

(Multilayer printed circuit board)

The unnecessary part of the copper foil of said copper-clad laminate was etched away to make an interlayer substrate, and said 50 μm thick glass-reinforced epoxy prepreg was placed on both sides of said substrate. On the outside of said prepreg was further laminated an 18 μm thick single-sided roughened copper foil so that the roughened side thereof would face the prepreg, and the assembly was hot pressure molded under the conditions of 175° C., 2 MPa and 60 minutes to make a multilayer copper-clad laminate having inner layer circuits.

Surface roughness of this multilayer copper-clad laminate was measured by a feeler type surface roughness tester. At the location of measurement on the outer layer surface on a 25 mm long straight line including the portion having the inner layer circuit immediately therebelow and the portion having no such circuit, the 10-point average of level difference between said portions was greater than 8 µm.

A predetermined position of the surface copper foil of said multilayer copper-clad laminate was etched away to form a 75 µm-diameter opening, and it was tried to drill this opening by an impact laser mfd. by Sumitomo Heavy Industries, Ltd., but the glass portion could not be removed.

COMPARATIVE EXAMPLE 12

(Adhesive film)

A resin varnish comprising 50 parts by weight of a high-molecular weight epoxy polymer having a weight-average molecular weight of 50,000, N,N-dimethylacetamide used as diluent in such an amount that said high-molecular weight epoxy polymer would become 30% by weight as solids, 50 parts by weight of a bisphenol A epoxy resin (molecular weight: 343; epoxy equivalent: 175), 0.2 equivalent of a phenol resin masked diisocyanate as crosslinking agent of said high-molecular weight epoxy polymer, and 0.5 part by weight of 2-ethyl-4-methylimidazole as curing agent was knife coated on an 18 µm thick copper foil and a 50 µm thick PET film and dried by heating at 150° C. for 10 minutes to half cure the resin while removing the solvent to make a copper-foiled adhesive film having an adhesive layer thickness of 50 µm and a PET film-attached adhesive film having an adhesive layer thickness of 50 µm. PET film was peeled off from the PET film-attached adhesive film to make a 50 µm thick adhesive film comprising an epoxy resin.

The thus produced adhesive films suffered no trouble such as break during peeling of the PET film and normal handling and could be cut clean without causing scattering of resin by a cutting knife and shears, but they were liable to blocking and had poor handling qualities.

(Galvanic corrosion test)

Insulation resistance of the test pieces measured in the same way as in Example 5 was higher than $10^9$ Ω, indicating excellent galvanic corrosion resistance of said adhesive films.

(Multilayer printed circuit board)

Said 50 µm thick adhesive film was placed on both sides of the interlayer substrate manufactured in Comparative Example 10, and. on the outside of said adhesive film was further laminated an 18 µm thick single-sided roughened copper foil so that its roughened side would face the adhesive film, followed by hot pressure molding of the assembly under the conditions of 175° C., 2 MPa and 60 minutes to make a multilayer copper-clad laminate having inner layer circuits.

Surface roughness of this multilayer copper-clad laminate was determined by a feeler type surface roughness tester. At the location of measurement on the outer layer surface on a 25 mm straight line including the portion having the inner layer circuit immediately therebelow and the portion having no such circuit, the 10-point average of level difference between said portions was less than 3 µm, indicating excellent surface flatness suited for circuit working of said laminate.

Using this multilayer copper-clad laminate having inner layer circuits, a 10-layer printed circuit board was made in the same way as in Example 5.

(Test of multilayer printed circuit board)

A part of this multilayer printed circuit board was cut out and its thermal expansion coefficient and bending modulus were measured according to TMA and bending mode DMA, respectively. The mean thermal expansion coefficient of the longitudinal and transvese directions was 30 ppm/° C. (at normal temperature) and the mean bending modulus of the longitudinal and transverse directions was 20 GPa at normal temperature and 10 GPa at an elevated temperature (200° C.). Barcol surface hardness of the board was 30 at normal temperature and 10 at an elevated temperature (200° C.).

(Wire bonding workability)

Bare chips were mounted at a part of said 10-layer printed circuit board and connected to the surface circuits by wire bonding. Wire bonding was conducted under the conditions of ultrasonic output=1 W; ultrasonic output duration=50 µs; bonding load=100 g. Separation of the wires took place even when the wire bonding temperature was lowered to 100° C.

(Thermal shock test)

In the thermal shock test conducted in the same way as in Example 1, disconnection occurred at the solder joints after around 100 test cycles. There was also noted disconnection in the conduction test of the circuits including interstitial via holes in the board.

As described above, according to the insulating varnish producing method in the fourth embodiment of the present invention, it is possible to prevent the electrical insulating whiskers from existing in the form of aggregates in the whiskers-incorporated adhesive film, thereby elevating insulation reliability of the adhesive film. The insulating material obtained by using the insulating varnish produced according to the fourth embodiment of the present invention is indebted for its realization to the addition of electrical insulating whiskers which made it possible to shape the epoxy resin prepregs into a sheet, and the printed circuit boards using this insulating material have good circuit workability because of flat surface, high packaging reliability because of high rigidity, good wire bonding workability because of high surface hardness, and excellent dimensional stability because of small thermal expansion coefficient. Thus, this embodiment of the present invention greatly contributes to the realization of higher packaging density, smaller size, higher reliability and lower cost of the multilayer printed circuit boards.

EXAMPLE 9

(Varnish)

In a resin varnish comprising 70 parts by weight of a bisphenol A novolak epoxy resin (molecular weight: 1,200; epoxy equivalent: 208), 30 parts by weight of a bisphenol A novolak resin (molecular weight: 700; hydroxyl equivalent: 118), 0.5 part by weight of 2-ethyl-4-methylimidazole and 70 parts by weight of methyl ethyl ketone, the aluminum borate whiskers having an average diameter of 0.8 µm and an average fiber length of 20 µm were blended in an amount of 90 parts by weight per 100 parts by weight of resin solids and stirred until a slurry of said whiskers was formed.

This slurry was mixed and milled by passing it twice through an alumina-made three-roll mill and deaerated by a vacuum dryer to obtain an insulating varnish.

(Adhesive film)

This insulating varnish was knife coated on the 18 µm thick copper foils and the 50 µm thick PET films and dried by heating at 150° C. for 10 minutes to half cure the resins while removing the solvent to make the copper-foiled adhesive films having an adhesive layer thickness of 50 µm and 100 µm and the PET film-attached adhesive films having an adhesive layer thickness of 50 µm and 100 µm. PET film was peeled off from the PET film-attached adhesive films to obtain the 50 μm and 100 μm thick adhesive films comprising whiskers and half-cured epoxy resin with a whisker volume fraction of 30%.

The produced copper-foiled adhesive films could be cut clean without causing scattering of resin by a cutting knife and shears, showed no liability to blocking and had good handling qualities. Also, the adhesive films obtained by coating the PET films with said insulating varnish suffered no trouble such as break during peeling of the PET film and normal handling, could be cut clean without causing scattering of resin by a cutting knife and shears, showed no liability to blocking and had good handling qualities.

(Galvanic corrosion test)

Insulation resistance of the test pieces measured in the same way as in Example 5 was higher than $10^9$ Ω. indicating excellent galvanic corrosion resistance of said adhesive films.

(Bending modulus)

The three-point bending modulus of the copper-clad laminate made by using said 100 μm thick adhesive film in the same way as in Example 5 was 20 GPa (average of measurements in the longitudinal and transverse directions).

(Drilling accuracy)

Positional discrepancy between the holes in the top and bottom laminates of a 0.3 mmφ-drilled 10-piece assembly of said copper-clad laminates was less than 20 μm.

(Multilayer printed circuit board)

Surface roughness of a multilayer copper-clad laminate having inner layer circuits made by using said 50 μm thick adhesive film in the same way as in Example 5 was measured by a feeler type surface roughness tester. At the location of measurement on the outer layer surface on a 25 mm long straight line including the portion having the inner layer circuit immediately therebelow and the portion having no such circuit, the 10-point average of level difference between said portions was less than 3 μm, indicating excellent surface flatness suited for circuit working of said laminate.

Using this multilayer copper-clad laminate having inner layer circuits, a 10-layer printed circuit board was made in the same way as in Example 5.

(Test of multilayer printed circuit board)

A part of this multilayer printed circuit board was cut out and its thermal expansion coefficient and bending modulus were determined according to TMA and bending mode DMA, respectively. The mean thermal expansion coefficient of the longitudinal and transverse directions was 10 ppm/° C. (at normal temperature) and the mean bending modulus of the longitudinal and transverse directions was 60 GPa at normal temperature and 40 GPa at an elevated temperature (200° C.). Barcol surface hardness of the board was 65 at normal temperature and 50 at an elevated temperature (200° C.).

(Wire bonding workability)

Wire bonding could be performed in a satisfactory way with the 10-layer printed circuit board according to the method of Example 1.

(Thermal shock test)

In the thermal shock test conducted in the same way as in Example 1, no trouble such as disconnection occured at the solder joints even after 2,000 test cycles. Also, there was seen no trouble such as disconnection in the conduction test of the circuits including interstitial via holes in the board.

EXAMPLE 10

(Varnish)

In a resin varnish comprising 70 parts by weight of a salicylaldehyde novolak epoxy resin (molecular weight: 1,000; epoxy equivalent: 180), 30 parts by weight of a bisphenol A novolak resin (molecular weight: 700; hydroxyl equivalent: 118), 0.5 part by weight of N-methylimidazole and 70 parts by weight of methyl ethyl ketone, the aluminum borate whiskers having an average diameter of 0.8 μm and an average fiber length of 20 μm were blended in an amount of 90 parts by weight per 100 parts by weight of resin solids and stirred until a slurry of said whiskers was formed.

This slurry was milled by passing it twice through an alumina-made three-roll mill and deaerated by a vacuum dryer to obtain an insulating varnish.

(Adhesive film)

This insulating varnish was knife coated on the 18 μm thick copper foils and the 50 μm thick PET films and dried by heating at 150° C. for 10 minutes to half cure the resins while removing the solvent to make the copper-foiled adhesive films having an adhesive layer thickness of 50 μm and 100 μm and the PET film-attached adhesive films having an adhesive layer thickness of 50 μm and 100 μm. PET film was peeled off the PET film-attached adhesive films to obtain the 50 μm and 100 μm thick adhesive films comprising whiskers and half-cured epoxy resin with et whisker volume fraction of 30%.

The thus obtained copper-foiled adhesive films could be cut clean without causing scattering of resin by a cutting knife and shears, were free from blocking and had good handling qualities. Also, the PET film-attached adhesive films suffered no trouble such as break during peeling of the PET film and normal handling, could be cut clean without causing scattering of resin by a cutting knife and shears, were free from blocking and had good handling qualities.

(Galvanic corrosion test)

Insulation resistance of the test pieces measured in the same way as in Example 5 was higher than $10^9$ Ω, indicating excellent galvanic corrosion resistance of said adhesive film.

(Bending modulus)

The three-point bending modulus of the copper-clad laminate obtained by using said 100 μm thick adhesive film in the same way as in Example 5 was 20 GPa (average of measurements in the longitudinal and transverse directions, without copper foil).

(Drilling accuracy)

Positional discrepancy between the holes in the top and bottom laminates of a 0.3 mmφ-drilled 10-piece assembly of said copper-clad laminates was less than 20 μm.

(Multilayer printed circuit board)

A multilayer copper-clad laminate having inner layer circuits was manufactured by using said 50 μm thick adhesive film in the same way as in Example 5 and its surface roughness was measured by a feeler type surface roughness tester. At the location of measurement on the outer layer surface on a 25 mm long straight line including the portion having the inner layer circuit immediately therebelow and the portion having no such circuit, the 10-point average of level difference between said portions was less than 3 μm, indicating excellent surface flatness suited for circuit working of said laminate.

Using this multilayer copper-clad laminate having inner layer circuits, a 10-layer printed circuit board was made in the same way as in Example 5.

(Test of multilayer printed circuit board)

A part of this multilayer printed circuit board was cut out and its thermal expansion coefficient and bending modulus were determined according to TMA and bending mode DMA, respectively. The mean thermal expansion coefficient of the longitudinal and transverse directions was 10 ppm/° C. (at normal temperature) and the mean bending modulus of the longitudinal and transverse directions was 60 GPa at normal temperature and 50 GPa at an elevated temperature (200° C.). Barcol surface hardness of the board was 55 at normal temperature and 55 at an elevated temperature (200° C.).
(Wire bonding workability)

Wire bonding could be performed in a satisfactory way with said 10-layer printed circuit board according to the method of Example 1.
(Thermal shock test)

In the thermal shock test conducted in the same way as in Example 1, no trouble such as disconnection occurred at the solder joints even after 2,000 test cycles. Also, there took place no trouble such as disconnection in the conduction test of the circuits including interstitial via holes in the board.

COMPARATIVE EXAMPLE 13

(Varnish)

In a resin varnish comprising 70 parts by weight of a bisphenol A novolak epoxy resin (molecular weight: 1,200; epoxy equivalent: 206), 30 parts by weight of a bisphenol A novolak resin (molecular weight: 700; hydroxyl equivalent: 118), 0.5 part by weight of 2-ethyl-4-methylimidazole and 70 parts by weight of methyl ethyl ketone, the aluminum borate whiskers having an average diameter of 0.8 μm and an average fiber length of 20 μm were blended in an amount of 90 parts by weight per 100 parts by weight of resin solids and stirred until the whiskers were uniformly dispersed in the varnish.
(Adhesive film)

This insulating varnish was knife coated on the 18 μm thick copper foils and the 50 μm thick PET films and dried by heating at 150° C. for 10 minutes to half cure the resins while removing the solvent to make the copper-foiled adhesive films having an adhesive layer thickness of 50 μm and 100 μm and the PET film-attached adhesive films having an adhesive layer thickness of 50 μm and 100 μm. PET film was peeled off from the PET film-attached adhesive films to obtain the 50 μm and 100 μm thick adhesive films comprising whiskers and half-cured epoxy resin with a whisker volume fraction of 30%.

The produced copper-foiled adhesive films could be cut clean without causing scattering of resin by a cutting knife and shears, kept free from blocking and had good handling qualities.

The PET film-attached films suffered no trouble such as break during peeling of the PET film and normal handling, could be cut clean without causing scattering of resin by a cutting knife and shears, kept free from blocking and had good handling qualities.
(Galvanic corrosion test)

A galvanic corrosion test piece was made by using said 50 μm thick adhesive film in the same way as in Example 5. 50 V was applied across the inner and outer layer electrodes and the change with time of insulation resistance of the test piece was examined in an atmosphere of 85° C. and 85% RH. As a result, insulation resistance after 250 hours from start of the test was less than $10^9$ Ω, indicating poor galvanic corrosion resistance of said adhesive film.
(Bending modulus)

The three-point bending modulus of the copper-clad laminate made by using said 100 μm thick adhesive film in the same way as in Example 5 was 20 GPa (average of measurements in the longitudinal and transverse directions, without copper foil).
(Drilling accuracy)

Positional discrepancy between the holes in the top and bottom laminates of a 0.3 mmφ-drilled 10-piece assembly of said copper-clad laminates was less than 20 μm.

(Multilayer printed circuit board)

A multilayer copper-clad laminate having inner layer circuits was made by using said 50 μm thick adhesive film in the same way as in Example 5 and its surface roughness was measured by a feeler type surface roughness tester. As a result, at the location of measurement on the outer layer surface on a 25 mm straight line including the portion having the inner layer circuit immediately there below and the portion having no such circuit, the 10-point average of level difference between said portions was less than 3 μm, indicating excellent surface flatness suited for circuit working of said laminate.

Using this copper-clad laminate having inner layer circuits, a 10-layer printed circuit board was manufactured in the same way as in Example 5.
(Test of multilayer printed circuit board)

A part of said multilayer printed circuit board was cut out and its thermal expansion coefficient and bending modulus were determined according to TMA and bending mode DMA, respectively. The mean thermal expansion coefficient of the longitudinal and transverse directions was 10 ppm/° C. (at normal temperature) and the mean bending modulus of the longitudinal and transverse directions was 60 GPa at normal temperature and 40 GPa at an elevated temperature (200° C.). Barcol surface hardness of the board was 65 at normal temperature and 50 at an elevated temperature (200° C.).
(Wire bonding workability)

Wire bonding could be performed in a satisfactory way with said 10-layer printed circuit board according to the method of Example 1.
(Thermal shock test)

In the thermal shock test conducted in the same way as in Example 1, no trouble such as disconnection occurred at the solder joints even after 2,000 test cycles.

Also, there took place no trouble such as disconnection in the conduction test of the circuits including interstitial via holes in the board.

COMPARATIVE EXAMPLE 14

(Prepreg)

A resin varnish comprising 70 parts by weight of a bisphenol A novolak epoxy resin (molecular weight: 1,200; epoxy equivalent: 206), 30 parts by weight of a bisphenol A novolak resin (molecular weight: 700; hydroxyl equivalent: 118), 0.5 part by weight of 2-ethyl-4-methylimidazole and 70 parts by weight of methyl ethyl ketone was impregnated in the 50 μm and 100 μm thick pieces of glass cloth and dried by heating at 150° C. for 10 minutes to half cure the resins while removing the solvent to make the 60 μm and 110 μm thick epoxy prepregs comprising glass cloth and half-cured epoxy resin.

The produced prepregs, when cut by a cutting knife and shears, caused scattering of resin.
(Galvanic corrosion test)

On the copper foil surfaces on both sides of a 0.8 mm thick double-sided copper-clad glass-reinforced epoxy laminate, an etching resist pattern was formed to a configuration that would provide an inner layer electrode for use in the galvanic corrosion test, then the unnecessary part of each copper foil was removed by etching, and an epoxy prepreg having an insulating layer thickness of 60 μm and an 18 μm thick single-sided roughened copper foil were laminated on both sides thereof so that the epoxy prepreg would contact the electrode-forming pattern, followed by hot pressure molding of the assembly under the conditions of 175° C., 2 MPa and 60 minutes.

Then, at the part of the resulting laminate which was positioned in registration with the inner layer electrode pattern, there was formed by etching a pattern designed to provide an outer layer electrode to obtain a galvanic corrosion test piece. 50 V was applied accross these inner and outer electrodes and insulation resistance of the laminate after having been left in an atmosphere of 85° C. and 85% RH for 1,000 hours was measured. It was higher than $10^9$ Ω, confirming excellent galvanic corrosion resistance of the cured products of said epoxy prepregs.

(Bending modulus)

An 18 µm thick single-sided roughened copper foil was laminated on both sides of said 100 µm epoxy prepreg so that the roughened side of said copper foil would face the prepreg, and hot-pressure molded under the conditions of 175° C., 2 MPa and 60 minutes.

The copper foils of the obtained copper-clad laminate were etched away and bending modulus of the laminate was measured by a three-point bending test. It was 8 GPa (average of measurements in the longitudinal and transverse directions).

(Drilling accuracy)

Positional discrepancy between the holes in the top and bottom laminates of a 0.3 mmφ-drilled 10-piece assembly of said copper-clad laminates was greater than 50 µm.

(Multilayer printed circuit board)

The unnecessary part of the copper foils of said copper-clad laminate was etched away to make an interlayer substrate, and the previously made 60 µm thick glass-reinforced epoxy prepreg was placed on both sides thereof. On the outside of said prepreg layer was further laminated an 18 µm thick single-sided roughened copper foil so that the roughened side thereof would face the prepreg, followed by hot pressure molding of the assembly under the conditions of 175° C., 2 MPa and 60 minutes to make a multilayer copper-clad laminate having inner layer circuits.

Surface roughness of this multilayer copper-clad laminate was measured by a feeler type surface roughness tester. At the location of measurement on the outer layer surface on a 25 mm long straight line including the portion having the inner layer circuit immediately therebelow and the portion having no such circuit, the 10-point average of level difference between said portions was greater than 8 µm.

A predetermined position of the surface copper foil of said multilayer copper-clad laminate having inner layer circuits was etched to form a 75 µm-diameter opening, and it was tried to drill this opening by using an impact laser mfd. by Sumitomo Heavy Industries, Ltd., but the glass portion could not be removed.

With the insulating varnish producing method according to the fifth embodiment of the present invention, it has become possible to prevent the electrical insulating whiskers from existing in the form of aggregates in the whisker-incorporated adhesive films at the stage of the insulating varnish, thus elevating insulation reliability of the adhesive films. The adhesive film obtained by using the insulating varnish produced according to the fifth embodiment of the present invention is indebted for its realization to the addition of electrical insulating whiskers which made it possible to shape the epoxy resin prepregs into a sheet, and the printed circuit boards using this adhesive film are improved in circuit workability because of flat surface and have high packaging reliability because of high rigidity, excellent wire bonding workability because of high surface hardness, and good dimensional stability because of small thermal expansion coefficient. This embodiment of the present invention, therefore, greatly contributes to the realization of higher packaging density, smaller size, higher reliability and lower cost of the multilayer printed circuit boards.

EXAMPLE 11

A silane coupling agent A-187 (trade name of γ-glycidoxypropylmethoxysilane produced by Nippon Unicar Co., Ltd.) and methyl ethyl ketone were supplied into a glass flask provided with a stirrer, a condenser and a thermometer to prepare a treating solution with a solid content of 5% by weight. In this treating solution were blended 60% by weight of aluminum borate whiskers having an average diameter of 0.8 µm and an average fiber length of 20 µm, followed by one-hour stirring at room temperature to prepare a treated filler solution.

EXAMPLE 12

A silane coupling agent SZ-6032 (trade name of N-β-(N-vinylbenzylaminoethyl)-γ-aminopropyltrimethoxysilane hydrochloride produced by Toray Dow Corning Silicone Co., Ltd.) and methyl ethyl ketone were supplied into a glass flask provided with a stirrer, a condenser and a thermometer to prepare a treating solution with a solid content of 5% by weight. In this treating solution were blended 60% by weight of aluminum borate whiskers having an average diameter of 0.8 µm and an average fiber length of 20 µm, followed by one-hour stirring at room temperature to prepare a treated filler solution.

EXAMPLE 13

A titanate coupling agent KR46B (trade name of isopropyltris(dioctylpyrophosphate) titanate produced by Ajinomoto Co., Ltd.) and methyl ethyl ketone were supplied into a glass flask provided with a stirrer, a condenser and a thermometer to prepare a treating solution with a solid content of 5% by weight. In this treating solution were blended 60% by weight of aluminum borate whiskers having an average diameter of 0.8 µm and an average fiber length of 20 µm, followed by one-hour stirring at room temperature to prepare a treated filler solution.

EXAMPLE 14

0.47 g of acetic acid and 18.9 g of distilled water were added to a solution of 40 g of tetramethoxysilane and 93 g of methanol in a glass flask provided with a stirrer, a condenser and a thermometer, and stirred at 50° C. for 8 hours to synthesize a silicone oligomer. The average number of thesiloxane repeating units of the obtained silicone oligomer was 20. Methyl ethyl keton was added to this silicone oligomer solution to prepare a treating solution with a solid content of 5% by weight. In this treating solution were blended 60% by weight of aluminum borate whiskers having an average diameter of 0.8 µm and an average fiber length of 20 µm, followed by one-hour stirring at room temperature to prepare a treated filler solution.

EXAMPLE 15

Similarly to Example 14, 0.53 g of acetic acid and 15.8 g of distilled water were added to a solution of 40 g of trimethoxymethylsilane and 93 g of methanol and stirred at 50° C. for 8 hours to synthesize a silicone oligomer. The average number of the siloxane repeating units of the obtained silicone oligomer was 15. Methyl ethyl ketone was added to this silicone oligomer solution to prepare a treating solution with a solid content of 5% by weight. In this treating solution were blended 60% by weight of aluminum borate whiskers having an average diameter of 0.8 µm and an average fiber length of 20 µm, followed by one-hour stirring at room temperature to prepare a treated filler solution.

EXAMPLE 16

Similarly to Example 14, 0.60 g of acetic acid and 14.0 g of distilled water were added to a solution of 34 g of dimethoxydimethylsilane, 8 g of tetramethoxysilane and 98 g of methanol and stirred at 50° C. for 8 hours to synthesize a silicone oligomer. The average number of the siloxane repeating units of the obtained silicone oligomer was 28. Methyl ethyl ketone was added to this silicone oligomer solution to prepare a treating solution with a solid content of 3% by weight. In this treating solution were blended 60% by weight of aluminum borate whiskers having an average diameter of 0.8 μm and an average fiber length of 20 μm, followed by one-hour stirring at room temperature to prepare a treated filler solution.

EXAMPLE 17

Similarly to Example 14, 0.60 g of acetic acid and 17.8 g of distilled water were added to a solution of 20 g of dimethoxydimethylsilane, 25 g of tetramethoxy silane and 105 g of methanol and stirred at 50° C. for 8 hours to synthesize a silicone oligomer. The average number of the siloxane repeating units of the obtained silicone oligomer was 30. Methyl ethyl ketone was added to this silicone oligomer solution to prepare a treating solution with a solid content of 5% by weight. In this treating solution were blended 60% by weight of aluminum borate whiskers having an average diameter of 0.8 μm and an average fiber length of 20 μm, followed by one-hour stirring at room temperature to prepare a treated filler solution.

EXAMPLE 18

Similarly to Example 14, 0.52 g of acetic acid and 18.3 g of distilled water were added to a solution of 20 g of trimethoxymethylsilane, 22 g of tetramethoxy silane and 98 g of methanol and stirred at 50° C. for 8 hours to synthesized silicone oligomer. The average number of the siloxane repeating units of the obtained silicone oligomer was 25. Methyl ethyl ketone was added to this silicone oligomer solution to prepare a treating solution with a solid content of 5% by weight. In this treating solution were blended 60% by weight of aluminum borate whiskers having an average diameter of 0.8 μm and an average fiber length of 20 μm, followed by one-hour stirring at room temperature to prepare a treated filler solution.

EXAMPLE 19

Similarly to Example 14, 0.52 g of acetic acid and 16.5 g of distilled water were added to a solution of 10 g of dimethoxydimethylsilane, 10 g of trimethoxymethylsilane, 20 g of tetramethoxysilane and 93 g of methanol and stirred at 50° C. for 8 hours to synthesize a silicone oligomer. The average number of the siloxane repeating units of the obtained silicone oligomer was 23. Methyl ethyl ketone was added to this silicone oligomer solution to prepare a treating solution with a solid content of 5% by weight. In this treating solution were blended 60% by weight of aluminum borate whiskers having an average diameter of 0.8 μm and an average fiber length of 20 μm, followed by one-hour stirring at room temperature to prepare a treated filler solution.

EXAMPLE 20

Similarly to Example 14, 0.34 g of acetic acid and 13.8 g of distilled water were added to a solution of 40 g of tetraethoxysilane and 93 g of methanol and stirred at 50° C. for 8 hours to synthesize a silicone oligomer. The average number of the siloxane repeating units of the obtained silicone oligomer was 19. Methyl ethyl ketone was added to this silicone oligomer solution to prepare a treating solution with a solid content of 5% by weight. In this treating solution were blended 60% by weight of aluminum borate whiskers having an average diameter of 0.8 μm and an average fiber length of 20 μm, followed by one-hour stirring at room temperature to prepare a treated filler solution.

EXAMPLE 21

To the silicone oligomer solution obtained in Example 14 were added a silane coupling agent A-187 (trade name of γ-glycidoxypropyltrimethoxysilane produced by Nippon Unicar Co., Ltd.) and methyl ethyl ketone to prepare a treating solution with a solid content of 5% by weight (silicone oligomer:A-187=50:50). In this treating solution were blended 60% by weight of aluminum borate whiskers having an average diameter of 0.8 μm and an average fiber length of 20 μm, followed by one-hour stirring at room temperature to prepare a treated filler solution.

EXAMPLE 22

To the silicone oligomer solution obtained in Example 14 were added a titanate coupling agent KR-46-B (trade name of isopropyltris(dioctylpyrophosphate) titanate produced by Ajinomoto Co., Ltd.) and methyl ethyl ketone to prepare a treating solution with a solid content of 5% by weight (silicone oligomer:KR-46-B=50:50). In this treating solution were blended 60% by weight of aluminum borate whiskers having an average diameter of 0.8 μm and an average fiber length of 20 μm, followed by one-hour stirring at room temperature to prepare a treated filler solution.

(Varnish resin composition A)

The solutions obtained in Examples 11 to 22 were heated to 50° C., and the following resins were added to these solutions in the amounts shown below per 300 parts by weight of the solutions to prepare the varnishes with a solid content of 75% by weight:

|  | parts by weight |
| --- | --- |
| Bisphenol A novolak epoxy resin (epoxy equivalent: 210) | 100 |
| Bisphenol A novolak resin (hydroxyl equivalent: 123) | 40 |
| Tetrabrominated bisphenol A (hydroxyl equivalent: 272) | 40 |
| Imidazole-based curing accelerator | 0.5 |

(Varnish resin composition B)

To 400 parts by weight of the 50° C. Examples 11–22 solutions were added the following resins in the amounts shown below and 100 parts by weight of methyl ethyl ketone to prepare the varnishes with a solid content of 65% by weight:

|  | parts by weight |
| --- | --- |
| Bisphenol A novolak epoxy resin (epoxy equivalent: 210) | 100 |
| Brominated phenoxy resin (epoxy equivalent: 12,940) | 70 |
| Bisphenol A novolak resin (hydroxyl equivalent: 123) | 40 |

-continued

|  | parts by weight |
|---|---|
| Tetrabrominated bisphenol A (hydroxyl equivalent: 272) | 30 |
| Imidazole-based curing accelerator | 0.5 |

COMPARATIVE EXAMPLE 15

A varnish was produced by following the procedure of Example 11 using as electrical insulating whiskers untreated aluminum borate whiskers having an average diameter of 0.8 µm and an average fiber length of 20 µm which have not been treated with a solvent solution.

COMPARATIVE EXAMPLE 16

In the varnish of Comparative Example 15 was blended 2 parts by weight of a silane coupling agent A-187 (trade name of γ-glycidoxypropyltrimethoxysilane produced by Nippon Unicar Co., Ltd.).

COMPARATIVE EXAMPLE 17

A varnish was produced by following the same procedure as Example 11 except that the aluminum borate whiskers having an average diameter of 0.8 µm and an average fiber length of 20 µm were treated using an epoxy-modified silicone oil KF-101 (a trade name, produced by Shin-Etsu Chemical Industries Co., Ltd.) in place of the silane coupling agent.

COMPARATIVE EXAMPLE 18

Silane coupling agent A-187 (trade name of γ-glycidoxypropyltrimethoxysilane produced by Nippon Unicar Co., Ltd.) was dissolved in methanol to prepare a treating solution with a solid content of 1% by weight. In this solution, the aluminum borate whiskers having an average diameter of 0.8 µm and an average fiber length of 20 µm were immersed with stirring at room temperature for one hour and then dried at 120° C. for one hour to effectuate surface treatment. Using the thus treated aluminum borate whiskers, a varnish was produced in the same way as in Example 1.

COMPARATIVE EXAMPLE 19

A thermosetting resin mainly composed of the same resins as used in Example 11 was impregnated in the 50 µm and 100 µm thick pieces of glass cloth and dried by heating at 150° C. for 10 minutes to half cure the resins while removing the solvent to make the 50 µm and 100 µm thick glass-reinforced epoxy prepregs comprising glass cloth and half cured epoxy resin.

COMPARATIVE EXAMPLE 20

A thermosetting resin having film forming properties mainly composed of a high-molecular weight epoxy polymer having a weight-average molecular weight of 50,000 and a bisphenol A epoxy resin was knife coated on an 18 µm thick copper foil and a 50 µm thick PET film and dried by heating at 150° C. for 10 minutes to half cure the resins while removing the solvent to make a copper-foiled insulating material comprising half-cured epoxy resins with an insulating layer thickness of 50 µm and a 50 µm thick adhesive film comprising half-cured epoxy resins, the latter film being obtained by peeling the PET film off from the base.

The insulating varnishes produced in Examples 11–22 and Comparative Examples 15–18 were respectively knife coated on the 18 µm thick copper foils and the 50 µm thick PET films and dried by heating at 150° C. for 10 minutes to half cure the resins while removing the solvent to make the copper-foiled insulating materials with an insulating layer thickness of 50 µm and 100 µm comprising whiskers and half cured epoxy resin with a whisker volume fraction of 30%, and a 50 µm thick insulating material comprising half-cured epoxy resin, which was obtained by peeling the PET film off from the base.

The produced insulating materials were evaluated with regard to the following items.

(Handling qualities of B-stage film)

Handling qualities were indicated by ○ mark for the insulating material which could be cut clean without causing scattering of resin and showed no liability to blocking, and X mark for the other insulating materials.

(Cured product properties)

The copper-foiled insulating materials having an insulating layer thickness of 50 µm produced in the manner described above were placed one on the other so that the insulating layers of the respective materials would face each other, and hot-pressure molded. After molding, the copper foil portion was removed by etching to obtain the objective resin plate, and its elastic modulus and thermal expansion coefficient were determined according to TMA and DMA in tensile mode, respectively.

(Galvanic corrosion resistance test)

On a 0.8 µm thick double-sided copper-clad glass-reinforced epoxy laminate was formed, by etching, a pattern desinged to provide the inner layer electrode for the corrosion test, and on both sides thereof was further laminated said copper-foiled insulating material with an insulating layer thickness of 50 µm so that the insulating material would contact the inner layer electrode pattern, followed by hot pressure molding of the assembly. At the part of the thus obtained laminate which was positioned in registration with said inner layer electrode pattern, there was formed, by etching, a pattern desinged to provide the outer layer electrode, thus making a galvanic corrosion test piece. 50 V was applied across said inner and outer layer electrodes, and insulation resistance of the laminate was measured afterleaving it in an atmosphere of 85° C. and 85% RH for 1,000 hours. In evaluation of insulation resistance, ○ mark was given to the samples which showed insulation resistance higher than $10^9$ Ω, and X mark to the other samples.

(Surface roughness)

An 18 µm thick single-sided roughened copper foil was laminated on both sides of said 100 µm thick glass-based epoxy resin prepreg so that the roughened side of the copper foil would face the insulating material, followed by hot pressure molding. Circuits were formed on the resulting copper-clad laminate, and on both sides thereof was laminated said 50 µm thick insulating material of the present invention, and on the outside thereof was further laminated an 18 µm thick singe-side roughened copper foil so that its roughened side would face the insulating material, followed by hot pressure molding to produce a multilayer copper-clad laminate having inner layer circuits.

Surface roughness of this multilayer copper-clad laminate was measured by a feeler type surface roughness tester. Measurement was made on the outer layer surface on a 25 mm straight line including the portion having the inner layer circuit immediately therebelow and the portion having no such circuit. The test result was indicated by ○ mark when the 10-point average of level difference between said two portions was less than 3 μm, and X mark when it was determined otherwise.

(Reliability-under-heat test)

A predetermined position of the surface copper foil of the multilayer copper-clad laminate having inner layer circuits was etched to form a 75 μm-diameter opening, and this opening was drilled by an impact laser mfd. by Sumitomo Heavy Industries, Ltd., followed by a smearing treatment with permanganic acid, electroless plating, pattern printing and etching to form the circuits. On both sides of this multilayer printed circuit board was laminated a 50 μm thick insulating material of the present invention, and on the outside thereof was further laminated an 18 μm thick single-sided roughened copper foil so that its roughened side would face the insulating material, followed by hot pressure molding to produce a multilayer copper-clad laminate having inner layer circuits. A predetermined position of its surface copper foil was etched to form a 75 μm-diameter opening, and this opening was laser drilled by an impact laser mfd. by Sumitomo Heavy Industries, Ltd., followed by a smearing treatment with permanganic acid, electroless plating, pattern printing and etching to form the circuits. The above operations were repeated to make a 10-layer printed circuit board. The samples which could be laser drilled as desired were represented by ○ mark and those which could not be laser drilled were represented by X mark.

Bare chips were mounted at a part of this 10-layer printed circuit board and connected to the surface circuits by wire bonding. Wire bonding was conducted under the following conditions: ultrasonic output=1 W; ultrasonic output duration=50 μs; bonding load=100 g; wire bonding temperature=180° C. The boards with which wire bonding could be performed in a satisfactory way were marked ○, and the other boards were marked X.

8 mm×20 mm TSOP's were mounted on said 10-layer printed circuit board and connected to the surface circuits by solder, and the TSOP-mounted board was subjected to a −65° C.⇔150° C. thermal cycle test. The samples were marked ○ when no trouble such as disconnection occurred at the solder joints after 2,000 cycles, and X when such trouble occurred.

The boards were also subjected to a conduction test of the circuits including interstitial via holes in the board. The boards which suffered no trouble such as disconnection in the test were marked ○ and those which suffered such trouble were marked X. The results are shown in Table 1 and Table 2.

TABLE 1

| | | Examples | | | | | | | | | | | | | | | | | | | | | | |
|---|---|---|---|---|---|---|---|---|---|---|---|---|---|---|---|---|---|---|---|---|---|---|---|---|
| | | 11 | | 12 | | 13 | | 14 | | 15 | | 16 | | 17 | | 18 | | 19 | | 20 | | 21 | | 22 |
| Varnish resin composition | | A | B | A | B | A | B | A | B | A | B | A | B | A | B | A | B | A | B | A | B | A | B | A | B |
| Handling qualities of B-stage film | | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ |
| Elastic modulus | 30° C. | 12 | 13 | 12 | 13 | 12 | 13 | 12 | 13 | 12 | 13 | 12 | 13 | 12 | 13 | 12 | 13 | 12 | 13 | 12 | 13 | 12 | 13 | 12 | 13 |
| (GPa) | 150° C. | 7 | 8 | 7 | 8 | 7 | 8 | 7 | 8 | 7 | 8 | 7 | 8 | 7 | 8 | 7 | 8 | 7 | 8 | 7 | 8 | 7 | 8 | 7 | 8 |
| Thermal | Below Tg | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 |
| expansion coefficient (ppm) | Above Tg | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 |
| Galvanic corrosion resistance test | | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ |
| Surface roughness | | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ |
| Wire bonding workability | | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ |
| Laser workability | | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ |
| Thermal cycle test | Solder joints | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ |
| | Conduction test | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ |

TABLE 2

| | | Comp. Examples | | | | | | | | | | |
|---|---|---|---|---|---|---|---|---|---|---|---|---|
| | | 15 | | 16 | | 17 | | 18 | | 19 | | 20 |
| Varnish resin composition | | A | B | A | B | A | B | A | B | A | B | — |
| Handling qualities of B-stage film | | ○ | ○ | ○ | ○ | ○ | ○ | ○ | ○ | X | X | ○ |
| Elastic modulus | 30° C. | 8 | 11 | 8 | 11 | 8 | 11 | 8 | 11 | 10 | 10 | 3 |
| (GPa) | 150° C. | 4 | 3 | 4 | 3 | 4 | 3 | 4 | 3 | 8 | 8 | 0.005 |
| Thermal | Below Tg | 22 | 22 | 22 | 22 | 22 | 22 | 22 | 22 | 22 | 22 | 65 |
| expansion coefficient (ppm) | Above Tg | 50 | 50 | 50 | 50 | 50 | 50 | 50 | 50 | 40 | 40 | — |
| Galvanic corrosion resistance test | | X | X | X | X | X | X | X | X | ○ | ○ | ○ |
| Surface roughness | | ○ | ○ | ○ | ○ | ○ | ○ | ○ | ○ | X | X | X |
| Wire bonding workability | | ○ | ○ | ○ | ○ | ○ | ○ | ○ | ○ | ○ | ○ | X |
| Laser workability | | ○ | ○ | ○ | ○ | ○ | ○ | ○ | ○ | X | X | ○ |
| Thermal cycle test | Solder joints | ○ | ○ | ○ | ○ | ○ | ○ | ○ | ○ | — | — | X |
| | Conduction test | ○ | ○ | ○ | ○ | ○ | ○ | ○ | ○ | — | — | X |

Examples 11 to 22 show that the laminates treated according to the process of the present invention are lowered in thermal expansion coefficient and elevated in galvanic corrosion resistance without their specific properties being affected, as compared with the non-treated laminates.

The insulating varnish according to the sixth embodiment of the present invention is capable of improving dispersibility of filler whiskers and adhesive force at the interfaces as such varnish is produced by directly blending resin material in a treating solvent solution blended with surface-treated electrical insulating whiskers. It is also possible to lower thermal expansion coefficient and elevate insulation reliability of the multilayer printed circuit boards using such whisker-incorporated insulating material. The insulating material obtained by using the insulating varnish produced according to the sixth embodiment of the present invention owes for its realization to the incorporation of electrical insulating whiskers which made it possible to shape the epoxy prepregs into a sheet, and the printed circuit boards using such insulating material are bettered in circuit workability because of flat surface, elevated in packaging reliability because of high rigidity, and improved in dimensional stability because of small thermal expansion coefficient.

As described above, according to the sixth embodiment of the present invention, there are provided a process for producing an insulating varnish for multilayer printed circuit boards capable of realizing higher packaging density, smaller size, higher reliability and lower cost, insulating varnishes produced from such process, and multilayer printed circuit boards using such insulating varnishes.

What is claimed is:

1. A process for producing an insulating varnish, which comprises providing a resin varnish containing electrical insulating whiskers which have an average diameter of 0.3 to 3 μm and an average length of 3 to 50 μm, and adding an ion absorbent or an organic reagent for preventing injury from copper, to the resin varnish containing electrical insulating whiskers which have an average diameter of 0.3 to 3.0 μm and an average length of 3 to 50 μm.

2. The process according to claim 1, wherein the ion adsorbent is an inorganic one and added in an amount of 1 to 10 parts by weight per 100 parts by weight of the resin.

3. The process according to claim 1, wherein the electrical insulating whiskers have an elastic modulus of at least 200 GPa.

4. The process according to claim 1, wherein the electrical insulating whiskers are of at least one material selected from the group consisting of aluminum borate, wollastonite, potassium titanate, basic magnesium sulfate, silicon nitride and alpha-alumina.

5. The process according to claim 1, wherein the electrical insulating whiskers are made of aluminum borate.

6. The process according to claim 1, wherein the electrical insulating whiskers are contained in the resin varnish in an amount of 5–350 parts by weight per 100 parts by weight of resin solids.

7. A process for producing an insulating varnish, which comprises providing a resin varnish containing electrical insulating whiskers, and refining the resin varnish containing electrical insulating whiskers by passing it through a filter, wherein the electrical insulating whiskers are ceramic whiskers whose average diameter is 0.3 to 3.0 μm and average length is 3 to 50 μm.

8. A process for producing an insulating varnish, which comprises preparing a slurry of whiskers by stirring said whiskers, which show cohesiveness in a dry state, in an organic solvent, and adding this slurry to a resin varnish, followed by further stirring, wherein the insulating varnish obtained by adding, stirring and mixing the slurry in the resin varnish is further milled by a beads mill to adjust the whisker average length in the range of 3 to 30 μm.

9. A process for producing an insulating varnish, which comprises preparing a slurry of electrical insulating whiskers by stirring said whiskers in a resin varnish, and milling this slurry by a beads mill or a three-roll mill, wherein the electrical insulating whiskers to be milled by a three-roll mill are the ceramic whiskers having an average diameter of 0.3 to 3 μm and an average length of 3 to 50 μm.

10. A process for producing an insulating varnish, which comprises providing a resin varnish containing electrical insulating whiskers, and refining the resin varnish containing electrical insulating whiskers by passing it through a filter, wherein the filter has an opening size of 50 to 100 μm.

11. The process according to claim 7, wherein the electrical insulating whiskers are of at least one material selected from the group consisting of aluminum borate, wollastonite, potassium titanate, basic magnesium sulfate, silicon nitride and alpha-alumina.

12. The process according to claim 8, wherein the electrical insulating whiskers are of at least one material selected from the group consisting of aluminum borate, wollastonite, potassium titanate, basic magnesium sulfate, silicon nitride and alpha-alumina.

13. The process according to claim 9, wherein the whiskers are of at least one material selected from the group consisting of aluminum borate, wollastonite, potassium titanate, basic magnesium sulfate, silicon nitride and alpha-alumina.

* * * * *